United States Patent
Kuribayashi et al.

(10) Patent No.: US 9,941,362 B2
(45) Date of Patent: Apr. 10, 2018

(54) METHOD OF MANUFACTURING SILICON CARBIDE SEMICONDUCTOR DEVICE

(71) Applicant: FUJI ELECTRIC CO., LTD., Kawasaki-shi, Kanagawa (JP)

(72) Inventors: Hidenao Kuribayashi, Matsumoto (JP); Masayuki Miyazaki, Matsumoto (JP)

(73) Assignee: FUJI ELECTRIC CO., LTD., Kawasaki-Shi, Kanagawa (JP)

(*) Notice: Subject to any disclaimer, the term of this patent is extended or adjusted under 35 U.S.C. 154(b) by 0 days.

(21) Appl. No.: 15/334,356

(22) Filed: Oct. 26, 2016

(65) Prior Publication Data

US 2017/0047408 A1   Feb. 16, 2017

Related U.S. Application Data

(63) Continuation of application No. PCT/JP2015/081907, filed on Nov. 12, 2015.

(30) Foreign Application Priority Data

Nov. 17, 2014  (JP) ................................ 2014-232711

(51) Int. Cl.
*H01L 29/15* (2006.01)
*H01L 29/16* (2006.01)
(Continued)

(52) U.S. Cl.
CPC .... *H01L 29/1608* (2013.01); *H01L 21/02529* (2013.01); *H01L 21/02609* (2013.01);
(Continued)

(58) Field of Classification Search
CPC ............ H01L 29/1608; H01L 29/36; H01L 29/66348; H01L 29/0615; H01L 29/32;
(Continued)

(56) References Cited

U.S. PATENT DOCUMENTS

2005/0116249 A1    6/2005 Mauder et al.
2006/0273323 A1   12/2006 Yamamoto et al.
(Continued)

FOREIGN PATENT DOCUMENTS

JP    2001-160559 A   6/2001
JP    2003-243323 A   8/2003
(Continued)

*Primary Examiner* — Vu A Vu
(74) *Attorney, Agent, or Firm* — Rabin & Berdo, P.C.

(57) ABSTRACT

A method of manufacturing a silicon carbide semiconductor device. The method includes providing an n-type semiconductor substrate having first and second principal surfaces, introducing an impurity from a first principal surface of the semiconductor substrate at a first position, activating the impurity to form a diffusion layer in the semiconductor substrate at a second position, implanting protons at a third position that is deeper from the first principal surface than the first position, the protons generating crystal defects in a region through which the protons pass, converting by thermal treating the protons into hydrogen induced donors to form an n-type field stop layer at a fourth position deeper from the first principal surface than the second position, reducing by the thermal treating the generated crystal defects to form an n-type crystal defect reduction region, and forming an electrode on the second principal surface after implanting the protons.

15 Claims, 9 Drawing Sheets

(51) Int. Cl.
*H01L 21/265* (2006.01)
*H01L 29/78* (2006.01)
*H01L 29/861* (2006.01)
*H01L 29/868* (2006.01)
*H01L 21/02* (2006.01)
*H01L 21/324* (2006.01)
*H01L 29/06* (2006.01)
*H01L 29/32* (2006.01)
*H01L 29/36* (2006.01)
*H01L 29/66* (2006.01)
*H01L 29/739* (2006.01)

(52) U.S. Cl.
CPC ...... *H01L 21/02694* (2013.01); *H01L 21/265* (2013.01); *H01L 21/26506* (2013.01); *H01L 21/324* (2013.01); *H01L 29/0615* (2013.01); *H01L 29/32* (2013.01); *H01L 29/36* (2013.01); *H01L 29/66068* (2013.01); *H01L 29/66348* (2013.01); *H01L 29/7397* (2013.01); *H01L 29/78* (2013.01); *H01L 29/861* (2013.01); *H01L 29/868* (2013.01)

(58) Field of Classification Search
CPC ........... H01L 21/02529; H01L 29/7397; H01L 21/324; H01L 21/26506; H01L 21/02694; H01L 21/02609; H01L 21/265; H01L 29/78; H01L 29/861
USPC .......................................................... 257/77
See application file for complete search history.

(56) References Cited

U.S. PATENT DOCUMENTS

| | | | |
|---|---|---|---|
| 2006/0286753 | A1 | 12/2006 | Barthelmess et al. |
| 2008/0315364 | A1 | 12/2008 | Nemoto |
| 2009/0184340 | A1 | 7/2009 | Nemoto et al. |
| 2012/0267681 | A1* | 10/2012 | Nemoto ................ H01L 21/263 257/139 |
| 2014/0061674 | A1 | 3/2014 | Imai |
| 2014/0151858 | A1 | 6/2014 | Schulze et al. |
| 2014/0231909 | A1* | 8/2014 | Willmeroth ......... H01L 29/0634 257/339 |
| 2014/0246755 | A1 | 9/2014 | Yoshimura et al. |
| 2014/0291723 | A1 | 10/2014 | Miyazaki et al. |
| 2015/0270132 | A1* | 9/2015 | Laven ................. H01L 21/2253 257/607 |

FOREIGN PATENT DOCUMENTS

| | | |
|---|---|---|
| JP | 2006-344688 A | 12/2006 |
| JP | 2009-099705 A | 5/2009 |
| JP | 2009-176892 A | 8/2009 |
| JP | 2012-248729 A | 12/2012 |
| JP | 2015-201476 A | 11/2015 |
| WO | WO-2007-055352 A1 | 5/2007 |
| WO | WO-2013/100155 A1 | 7/2013 |
| WO | WO-2013-108911 A1 | 7/2013 |

* cited by examiner

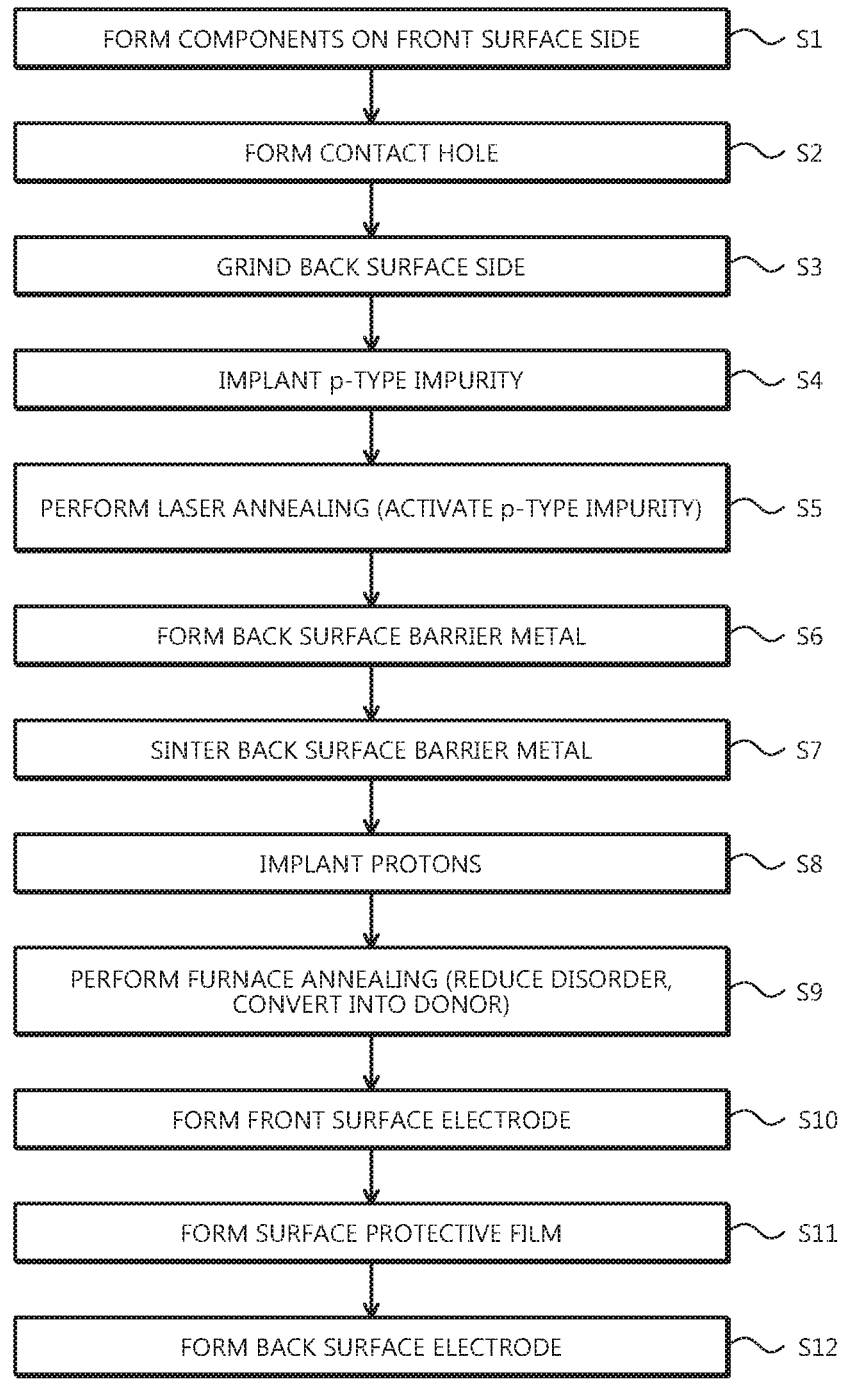

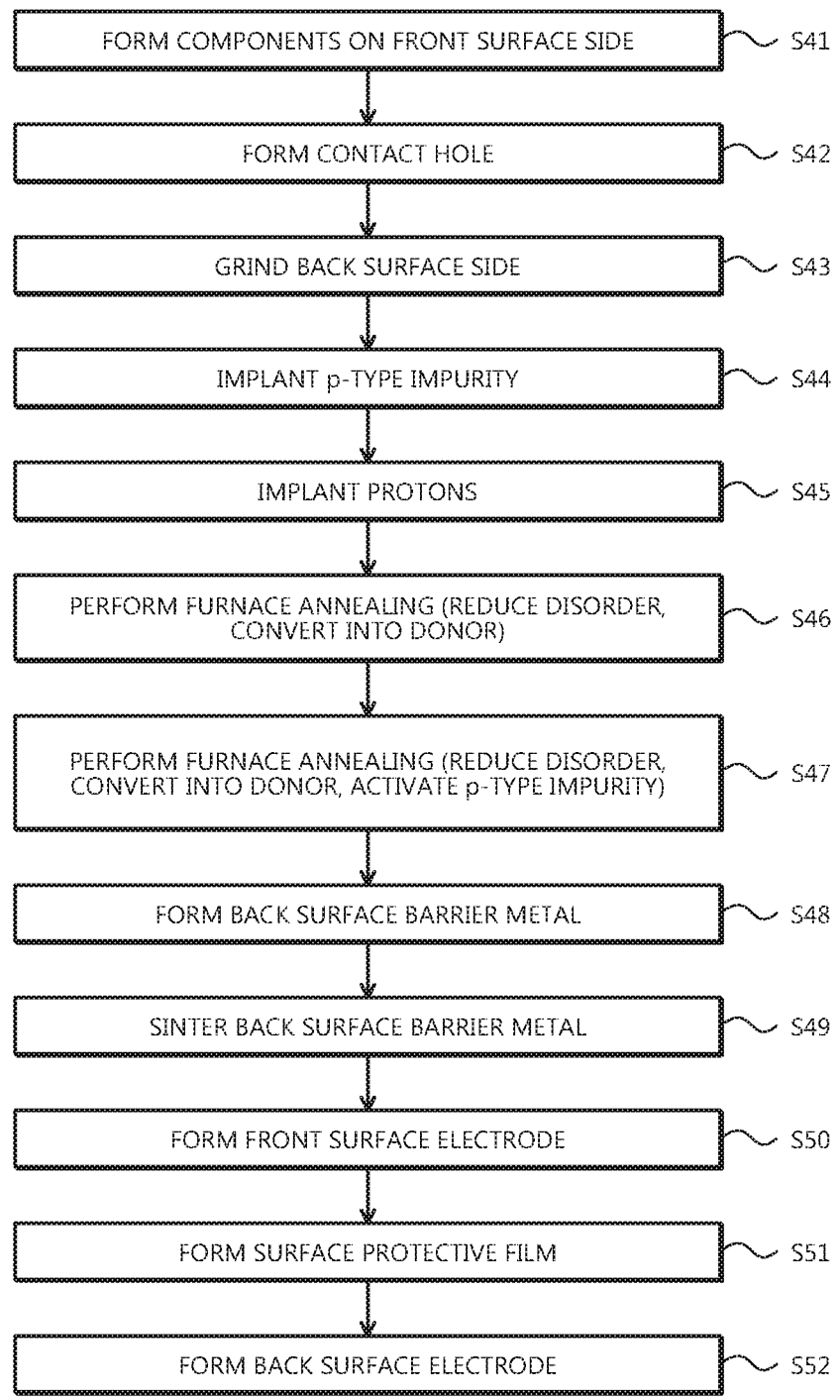

FIG. 7

| Rated Voltage (V) | Breakdown Voltage (V) | Total thickness of substrate W0 (μm) | Specific Resistance (Ωcm) | Drift Layer Average Concentration (/cm³) | Rated Current Density (A/cm²) | Distance Index L (mm) | FS layer first reached by depletion layer: Distance from back surface X (μm) | | | | | | | | | | | | |
|---|---|---|---|---|---|---|---|---|---|---|---|---|---|---|---|---|---|---|---|---|
| | | | | | | | W0-0.3L | W0-0.4L | W0-0.5L | W0-0.6L | W0-0.7L | W0-0.8L | W0-0.9L | W0-1.0L | W0-1.1L | W0-1.2L | W0-1.3L | W0-1.4L | W0-1.5L |
| 1200 | 1400 | 18 | 2.3 | $2.0 \times 10^{15}$ | 758 | 11.6 | 14.5 | 13.3 | 12.2 | 11.0 | 9.8 | 8.1 | 7.5 | 6.4 | 5.2 | 4.0 | 2.9 | 1.7 | 0.5 |
| 1700 | 1900 | 26 | 3.2 | $1.5 \times 10^{15}$ | 535 | 16.2 | 20.6 | 19.0 | 17.4 | 15.8 | 14.1 | 12.5 | 10.9 | 9.3 | 7.7 | 6.0 | 4.4 | 2.8 | 1.2 |
| 3300 | 3500 | 50 | 5.8 | $7.9 \times 10^{14}$ | 276 | 30.8 | 40.3 | 37.2 | 34.1 | 31.0 | 27.9 | 24.8 | 21.8 | 18.7 | 15.6 | 12.5 | 9.4 | 6.4 | 3.3 |
| 4500 | 4700 | 68 | 7.8 | $5.9 \times 10^{14}$ | 202 | 41.8 | 55.0 | 50.8 | 46.6 | 42.4 | 38.3 | 34.1 | 29.9 | 25.7 | 21.6 | 17.4 | 13.2 | 9.0 | 4.9 |
| 6500 | 6700 | 98 | 11.2 | $4.1 \times 10^{14}$ | 140 | 60.0 | 79.5 | 73.5 | 67.5 | 61.5 | 55.5 | 49.5 | 43.5 | 37.5 | 31.5 | 25.5 | 19.5 | 13.5 | 7.5 |
| 8500 | 8700 | 128 | 14.5 | $3.2 \times 10^{14}$ | 107 | 78.2 | 104.0 | 96.2 | 88.4 | 80.6 | 72.8 | 64.9 | 57.1 | 49.3 | 41.5 | 33.6 | 25.8 | 18.0 | 10.2 |
| 13000 | 14000 | 195 | 23.3 | $2.0 \times 10^{14}$ | 70 | 122.1 | 158.4 | 146.1 | 133.9 | 121.7 | 109.5 | 97.3 | 85.1 | 72.9 | 60.6 | 48.4 | 36.2 | 24.0 | 11.8 |
| 25000 | 26000 | 375 | 43.3 | $1.1 \times 10^{14}$ | 36 | 231.6 | 305.5 | 282.4 | 259.2 | 236.1 | 212.9 | 189.8 | 166.6 | 143.4 | 120.3 | 97.1 | 74.0 | 50.8 | 27.7 |
| 45000 | 46000 | 675 | 76.7 | $6.0 \times 10^{13}$ | 20 | 413.9 | 550.8 | 509.5 | 468.1 | 426.7 | 385.3 | 343.9 | 302.5 | 261.1 | 219.8 | 178.4 | 137.0 | 95.6 | 54.2 |

METHOD OF MANUFACTURING SILICON CARBIDE SEMICONDUCTOR DEVICE

CROSS REFERENCE TO RELATED APPLICATIONS

This is a continuation application of International Application PCT/JP2015/081907 filed on Nov. 12, 2015, which claims priority from a Japanese Patent Application No. 2014-232711 filed on Nov. 17, 2014, the contents of which are incorporated herein by reference.

BACKGROUND OF THE INVENTION

1. Field of the Invention

The embodiments discussed herein relate to a method of manufacturing a silicon carbide semiconductor device.

2. Description of the Related Art

Known power semiconductor devices include silicon (Si) diodes and insulated gate bipolar transistors (IGBTs) having breakdown voltages of 400 V, 600 V, 1200 V, 1700 V, 3300 V, or higher. These semiconductor devices are each used in power converting equipment such as converters and inverters. Excellent electric properties such as a low loss, high efficiency, and a high resistance to breakdown, and a low cost are demanded of power semiconductor devices.

The following method has been proposed as a method of manufacturing a silicon carbide semiconductor device. Front surface element structures are formed such as diffusion regions and a MOS gate (an insulated gate including a metal—an oxide film—a semiconductor) structure, on a front surface side of an $n^-$-type semiconductor substrate forming an $n^-$-type drift layer. The $n^-$-type semiconductor substrate is ground from a back surface side to reduce the thickness thereof to a position corresponding to the thickness of the product. Protons are implanted from the back surface after the grinding of the $n^-$-type semiconductor substrate and the substrate is thereafter thermally treated, whereby donors are produced based on compound defects including hydrogen (H) atoms implanted into the $n^-$-type semiconductor substrate, plural point defects in the $n^-$-type semiconductor substrate, and the like to form the n-type diffusion layer. The n-type diffusion layer whose doping concentration is higher than that of the $n^-$-type semiconductor substrate is an n-type field stop (FS) layer. The donors based on the compound defects including hydrogen atoms are called "hydrogen induced donors".

Recently, the development of a semiconductor device using a silicon carbide (SiC) semiconductor having a better figure of merit (FOM) than that of a silicon semiconductor (hereinafter, referred to as "silicon carbide semiconductor device") is actively pursued. When the rated voltage is particularly set to be a voltage equal to or higher than 10 kV, for a semiconductor device using a silicon semiconductor (hereinafter, referred to as "silicon semiconductor device"), the thickness of the $n^-$-type drift layer influencing the maintenance of the breakdown voltage and the conduction property, has to be close to 1000 μm, and high speed operation thereof is limited. In contrast, for a silicon carbide semiconductor device, the thickness of the $n^-$-type drift layer may be reduced up to about 100 μm. For use with voltage equal to or higher than 10 kV (for example, generation and delivery of a high voltage DC or the like), the manufacture (production) of a silicon carbide semiconductor device is extremely effective. When the rated voltage is set to be equal to or higher than 6 kV, the silicon carbide semiconductor device has to execute bipolar operation (in which both of electrons and holes are involved as charge carriers). With such high rated voltages, improvement of the doping concentration based on the n-type field stop layer is necessary also in silicon carbide semiconductor devices similar to silicon semiconductor devices, from the viewpoint of a low loss and suppression of oscillation of the current and voltage waveforms.

As a method of forming the n-type field stop layer using proton implantation, a technique has been proposed concerning degradation of the carrier (electrons and holes) mobility in the proton-implanted region (see, for example, US Patent Application 2005/0116249). As a method of forming the n-type field stop layer, conditions for thermal treatment are disclosed to recover the crystal defects generated during the proton implantation, for the thermal treatment executed after the proton implantation (see, for example, US Patent Application 2006/0286753). According to a proposed method of manufacturing an IGBT including an n-type field stop layer, the n-type field stop layer is formed using proton implantation and annealing (thermal treatment) and a collector layer is thereafter formed using ion implantation and laser annealing (see, for example, Japanese Laid-Open Patent Publication No. 2001-160559). In Japanese Laid-Open Patent Publication No. 2001-160559, the doping concentration of protons is recovered by annealing executed after the proton implantation.

According to another proposed method of forming the n-type field stop layer, the doping concentration of the protons is increased by recovering the defects by locally heating the semiconductor substrate at a temperature that is low to the extent that no outward diffusion of the protons occurs, using an electron beam or a laser after the proton implantation and before annealing to convert the protons into donors (hereinafter, referred to as "proton annealing") (see, for example, Japanese Laid-Open Patent Publication No. 2009-99705). According to a further proposed method, oxygen (O) atoms are introduced in advance into a silicon substrate; protons are implanted from the front surface of the silicon substrate; the proton annealing is thereafter executed in a hydrogen atmosphere; the silicon substrate is thereafter ground from the back surface side thereof to reduce the thickness thereof; phosphorus (P) is ion-implanted into the back surface after the grinding; and annealing is thereafter executed using a YAG laser (see, for example, Re-Publication of PCT International Publication No. 2007-55352). In Re-Publication of PCT International Publication No. 2007-55352, the degradation of the carrier mobility in the proton-implanted region is suppressed by introducing oxygen into the silicon substrate.

According to another method, after protons are implanted from the back surface of a substrate, annealing is executed with respect to the protons by applying a YAG laser light beam and a continuous wave (CW) laser light beam from the back surface of the substrate, whereby an n-type field stop layer (an n-type diffusion layer formed by donor production of the protons) is formed (see, for example, Japanese Laid-Open Patent Publication No. 2009-176892). According to further proposed method, at least one n-type intermediate layer that includes, as a pair, two layers of an n-type field stop layer whose doping concentration is higher than that of an $n^-$-type drift layer, and an n-type disorder reduction region whose doping concentration is lower than that of the n-type field stop layer and whose doping concentration is equal to or higher than that of the $n^-$-type drift layer, is formed between the $n^-$-type drift layer and a p-type collector layer (see, for example, PCT Publication WO 2013/108911). Concerning a method of forming the n-type field stop layer, it has been disclosed that protons are implanted into a silicon substrate and proton annealing is executed to thereafter further execute laser annealing and that the silicon substrate may be replaced with a silicon carbide substrate (see, for example, US Patent Application No. 2014/0151858). A method of improving the adhesion between a silicon carbide substrate and a back surface electrode has been proposed (see, for example, Japanese Laid-Open Patent Publication No. 2012-248729).

SUMMARY OF THE INVENTION

According to one aspect of the present invention, a method of manufacturing a silicon carbide semiconductor device, includes: introducing an impurity of a p-type or an n-type from a first principal surface of an n-type semiconductor substrate including silicon carbide; forming a diffusion layer of a p-type or an n-type in the n-type semiconductor substrate by activating the impurity; implanting protons at a position deeper than a position at which the impurity is introduced, from the first principal surface of the n-type semiconductor substrate; forming an n-type field stop layer at a position deeper than the diffusion layer from the first principal surface of the n-type semiconductor substrate by forming hydrogen induced donors by converting the protons into donors; forming an n-type crystal defect reduction region by reducing crystal defects generated in a proton passing-through region from the first principal surface of the n-type semiconductor substrate to a range of the protons; and forming an electrode on a second principal surface of the n-type semiconductor substrate. The protons are implanted before the electrode is formed. The forming the n-type field stop layer by forming hydrogen induced donors by converting the protons into donors and the forming the n-type crystal defect reduction region by reducing the crystal defects are executed by a same thermal treating.

In the method, the silicon carbide semiconductor device is manufactured by introducing the impurity, forming the diffusion layer by activating the impurity, implanting the protons, and performing the thermal treating, in this order.

In the method, the thermal treating heats the n-type semiconductor substrate overall.

In the method, the thermal treating heats the n-type semiconductor substrate overall by furnace annealing.

In the method, the forming the diffusion layer by activating the impurity, the forming the n-type field stop layer by forming the hydrogen induced donors by converting the protons into donors, and the forming the n-type crystal defect reduction region by reducing crystal defects are executed by the same thermal treating.

In the method, the silicon carbide semiconductor device is manufactured by introducing the impurity, implanting the protons, and performing the thermal treating, in this order.

In the method, the thermal heating heats the proton passing-through region.

In the method, the thermal treating heats the proton passing-through region by laser annealing executed by applying a laser light beam from the first principal surface of the n-type semiconductor substrate.

The method further includes forming a metal film to form an ohmic contact with the n-type semiconductor substrate in the first principal surface of the n-type semiconductor substrate. The impurity is activated by laser annealing executed by applying a laser light beam from the first principal surface of the n-type semiconductor substrate. The forming the metal film is executed after the forming the diffusion layer by activating the impurity.

In the method, the forming the metal film is executed after the thermal treating.

The method further includes forming a metal film to form an ohmic contact with the n-type semiconductor substrate in the first principal surface of the n-type semiconductor substrate. The forming the metal film is executed after the thermal treating.

In the method, the thermal treating is at a temperature higher than that of thermal treating to form the ohmic contact.

In the method, the thermal treating is at a temperature of a range from 900° C. to 1300° C.

In the method, the temperature is of a range from 1000° C. to 1200° C.

In the method, the temperature is equal to or higher than 1100° C.

The method further includes forming before introducing the impurity, a front surface element structure of an insulated gate bipolar transistor on a second principal surface side of the n-type semiconductor substrate. The impurity introduced is the p-type. The diffusion layer formed is of the p-type, forming a p-type collector layer.

The method further includes forming before introducing the impurity, a front surface element structure of a diode on a second principal surface side of the n-type semiconductor substrate. The impurity introduced is the n-type impurity. The diffusion layer formed is of the n-type, forming an n-type cathode layer.

According to another aspect of the invention, a silicon carbide semiconductor device includes: a diffusion layer of a p-type or an n-type formed in a surface layer of a first principal surface of an n-type semiconductor substrate including silicon carbide; an n-type field stop layer formed in the n-type semiconductor substrate, away from the diffusion layer at a position deeper than the diffusion layer from the first principal surface of the n-type semiconductor substrate, the n-type field stop layer having a mountain-shaped impurity concentration distribution having a peak higher than an impurity concentration of the n-type semiconductor substrate and a difference in concentration magnitude along a depth direction; an n-type crystal defect region formed in the n-type semiconductor substrate, at a position shallower than the n-type field stop layer from the first principal surface of the n-type semiconductor substrate, an impurity concentration of the n-type crystal defect region being lower than that of the n-type field stop layer, a crystal state of the n-type crystal defect region being in more disorder than that of the n-type semiconductor substrate; an element structure formed on a second principal surface of the n-type semiconductor substrate; a first electrode contacting the diffusion layer; and a second electrode formed on the second principal surface of the n-type semiconductor substrate. The n-type field stop layer includes an n-type semiconductor that includes, as donors, crystal defects including hydrogen atoms.

In the silicon carbide semiconductor device, the n-type field stop layer includes the n-type semiconductor including, as donors, crystal defects including vacancies, oxygen atoms, and hydrogen atoms.

In the silicon carbide semiconductor device, the n-type field stop layer includes more hydrogen atoms than the n-type crystal defect region.

In the silicon carbide semiconductor device, carrier mobility of the n-type crystal defect region is equal to or higher than 30% and equal to or lower than 100% of carrier mobility of the n-type semiconductor substrate.

Other objects, features, and advantages of the present invention are specifically set forth in or will become apparent from the following detailed description of the invention when read in conjunction with the accompanying drawings.

BRIEF DESCRIPTION OF THE DRAWINGS

FIG. 2 is a flowchart of an overview of the method of manufacturing a silicon carbide semiconductor device according to the first embodiment;

FIG. 3B is a flowchart of an overview of the method of manufacturing a silicon carbide semiconductor device according to a third embodiment;

FIG. 7 is a table of positional conditions of a field stop (FS) layer first reached by a depletion layer in the semiconductor device according to the present invention;

DETAILED DESCRIPTION OF THE INVENTION

Figure 1A:
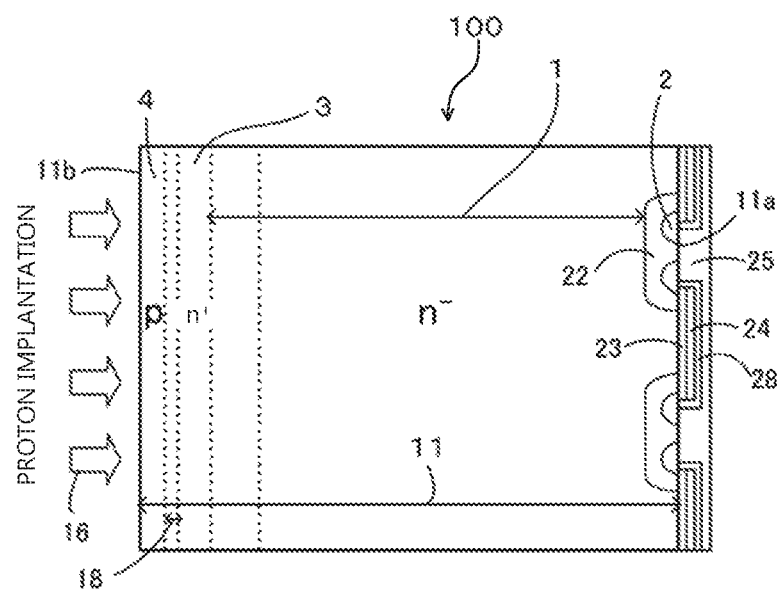
FIGS. 1A and 1B are explanatory diagrams of a structure of a semiconductor device manufactured using a method of manufacturing a silicon carbide semiconductor device according to a first embodiment.

Embodiments of a method of manufacturing a silicon carbide semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher (high doping concentration) or lower (low doping concentration), respectively, than layers and regions without + or −. In the description of the embodiments below and the accompanying drawings, identical constituent elements will be given the same reference numerals and will not be repeatedly described.

Figure 1B:
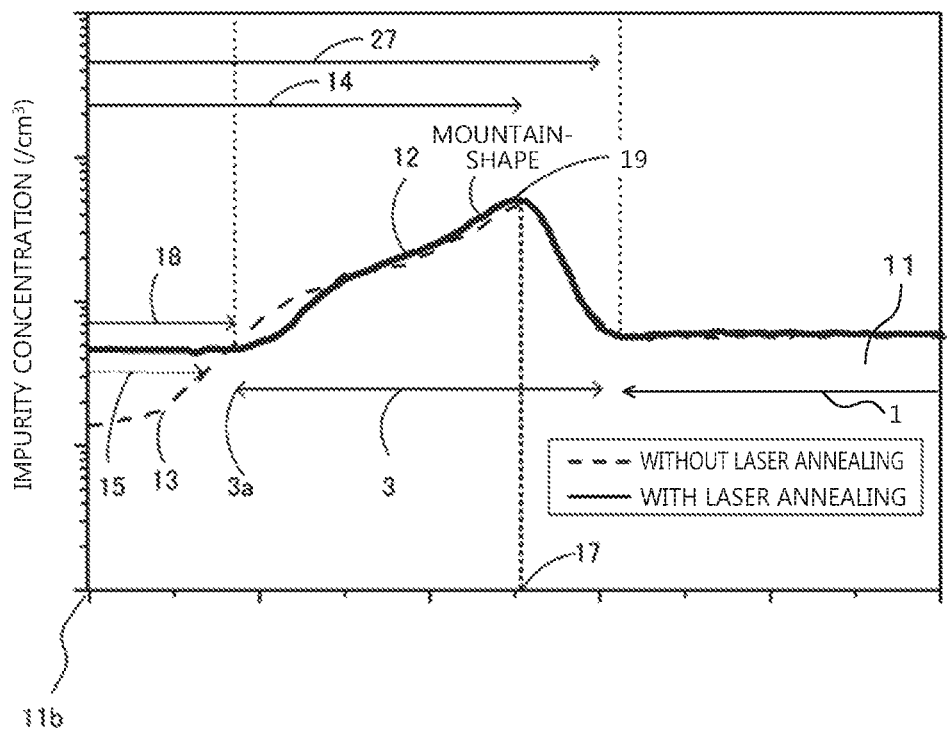

The structure will be described of a planar gate IGBT as an example of a silicon carbide semiconductor device manufactured using the method of manufacturing silicon carbide (SiC) semiconductor device according to the first embodiment (hereinafter, referred to as "SiC-IGBT"). FIGS. 1A and 1B are explanatory diagrams of the structure of the semiconductor device manufactured using the method of manufacturing a silicon carbide semiconductor device according to the first embodiment. FIG. 1A depicts a cross-sectional diagram of the main part of the SiC-IGBT 100 and FIG. 1B depicts a doping concentration profile taken in the vicinity of an N$^+$-type field stop layer 3. As depicted in FIGS. 1A and 1B, the silicon carbide semiconductor device according to the first embodiment has a MOS gate structure including a p-type base region 22, an n$^+$-type emitter region 2, a gate insulating film 23, and a gate electrode 24, formed on a front surface 11a side of an n$^-$-type silicon carbide substrate (a semiconductor chip) 11 forming an n$^-$-type drift layer 1.

For example, the p-type base region 22 is selectively formed in a surface layer of the front surface 11a of the n$^-$-type silicon carbide substrate 11. The n$^+$-type emitter region 2 is selectively formed inside the p-type base region 22. The gate electrode 24 is formed on the surface of a portion of the p-type base region 22 between the n$^+$-type emitter region 2 and the n$^-$-type drift layer 1, through the gate insulating film 23. The emitter electrode 25 contacts the p-type base region 22 and the n$^+$-type emitter region 2, and is electrically insulated from the gate electrode 24 by an interlayer insulating film 28. An n$^+$-type field stop layer 3 and a p-type collector layer (a diffusion layer) 4 are formed in the surface layer of a back surface 11b of the n$^-$-type silicon carbide substrate 11.

The n$^+$-type field stop layer 3 is an n-type diffusion layer formed by converting hydrogen ions such as protons (H$^+$) implanted 16 into the n$^-$-type silicon carbide substrate 11 (hereinafter, collectively referred to as "proton implantation"), deutrons (heavy hydrogen ions), and the like into donors. The n$^+$-type field stop layer 3 has a peak (a local maximum) 19 of its doping concentration higher than the doping concentration of the n$^-$-type silicon carbide substrate 11, and has a doping concentration profile 12 that has a mountain-like shape decreasing from the peak 19 of the doping concentration toward the sides of the collector and the emitter. The two or more n$^+$-type field stop layers 3 may be formed at different depths. The p-type collector layer 4 is formed at a position shallower than the n$^+$-type field stop layer 3, from the back surface 11b of the n$^-$-type silicon carbide substrate 11.

An n-type disorder reduction region (n-type crystal defect reduction region) 18 is formed between the n$^+$-type field stop layer 3 and the p-type collector layer 4. When the two or more n$^+$-type field stop layers 3 are formed, the n-type disorder reduction region 18 is also formed between the n$^+$-type field stop layers 3 that are adjacent to each other in a depth direction. The n-type disorder reduction region 18 is a region having therein reduced defects (disorders) that are generated by the disorder of the crystal state caused by the proton implantation 16 to form the n$^+$-type field stop layer 3 described later. The reason why the n-type disorder reduction region 18 is formed as above is as follows.

At the position at which the doping concentration of the n$^+$-type field stop layer 3 has its peak 19 (hereinafter, referred to as "peak position"), sufficient hydrogen (H) atoms are present and the disorders are therefore sufficiently few. On the other hand, the region between the adjacent n$^+$-type field stop layers 3 or the region between the n$^+$-type field stop layer 3 and the p-type collector layer 4 is distant from the peak position of the n$^+$-type field stop layer 3, and hydrogen atoms are therefore not so sufficient therein as those at the peak position. The region is therefore becomes a region having the disorders remaining therein. The n-type disorder reduction region 18 is the region present between the adjacent n$^+$-type field stop layers 3 or the region present between the n$^+$-type field stop layer 3 and the p-type collector layer 4.

In the region having the hydrogen atoms converted into donors, for example, VOH defects or compound defects including the VOH defects may be the donors that supply electrons. The "VOH defect" is a crystal defect formed by coupling of a vacancy (V), an oxygen (O) atom present in the n⁻-type silicon carbide substrate 11, and a hydrogen atom implanted into the n⁻-type silicon carbide substrate 11. The VOH defects or the compound defects each including the VOH defect will herein be simply referred to as "hydrogen induced donors".

The n-type disorder reduction region 18 contacts the n⁺-type field stop layer 3 and the p-type collector layer 4. The doping concentration of the n-type disorder reduction region 18 may be lower than the doping concentration at the peak position of the n⁺-type field stop layer 3 and may be substantially equal to or higher than the doping concentration of the n⁻-type drift layer 1. Hereinafter, a pair of one n⁺-type field stop layer 3 and one n-type disorder reduction region 18 adjacent to the side of the surface for the proton implantation will be referred to as "n-type intermediate layer 27".

The portion other than the p-type base region 22, the n⁺-type emitter region 2, the n⁺-type field stop layer 3, the p-type collector layer 4, and the n-type disorder reduction region 18, of the n⁻-type silicon carbide substrate 11 is the n⁻-type drift layer 1. The n⁻-type drift layer 1 has the main current flowing therethrough and has a function of maintaining the main breakdown voltage. A collector electrode not depicted contacts the p-type collector layer 4. The collector electrode includes a barrier metal layer and the back surface electrode sequentially stacked on the back surface 11b of the n⁻-type silicon carbide substrate 11.

The barrier metal layer includes, for example, a metal that is highly adhesive to the back surface electrode and that is capable of forming ohmic contact with the n⁻-type silicon carbide substrate 11. The barrier metal layer may be, for example, a metal layered film formed by sequentially depositing a nickel (Ni) film and a titanium (Ti) film, or a metal film including nickel and titanium. The back surface electrode may be, for example, a metal film including aluminum (Al) or an aluminum-silicon (Al—Si) alloy.

A method of manufacturing a silicon carbide semiconductor device according to the first embodiment will be described with reference to FIGS. 1A, 1B, and 2. FIG. 2 is a flowchart of an overview of the method of manufacturing a silicon carbide semiconductor device according to the first embodiment. Components on the front surface side of the substrate are formed on the front surface side 11a of the n⁻-type silicon carbide substrate 11 (a semiconductor wafer), such as the MOS gate structure including the p-type base region 22, the n⁺-type emitter region 2, the gate insulating film 23, and the gate electrode 24, and the interlayer insulating film 28 (step S1). A contact hole to form the p-type base region 22 and the n⁺-type emitter region 2 is formed in the interlayer insulating film 28 (step S2).

The n⁻-type silicon carbide substrate 11 is ground or polished (back grinding) from the back surface side thereof using, for example, a chemical mechanical polishing (CMP) method, to reduce the thickness thereof to the thickness of the product (step S3). The thickness of the product is a predetermined thickness determined based on the relation with a predetermined breakdown voltage. Ion implantation of a p-type impurity such as, for example, boron (B) or aluminum is executed from the back surface after the grinding of the n⁻-type silicon carbide substrate 11 (hereinafter, simply referred to as "back surface") to a position shallower than a range of protons (Rp) of the proton implantation 16 described later (step S4).

A laser light beam is applied from the back surface 11b of the p-type impurity of the n⁻-type silicon carbide substrate 11 (laser annealing) to activate the p-type impurity implanted at step S4 and form the p-type collector layer 4 (step S5). An Ni film and a Ti film are sequentially deposited on the back surface 11b of the n⁻-type silicon carbide substrate 11 to form the barrier metal layer (hereinafter, referred to as "back surface barrier metal" not depicted) (step S6). The deposition of the Ni film, the Ti film, and the like constituting the back surface barrier metal may be executed using, for example, a sputtering method. Sintering (thermal treatment) of the back surface barrier metal is executed to form ohmic contact between the back surface barrier metal and the n⁻-type silicon carbide substrate 11 (step S7). The temperature of the sintering of the back surface barrier metal may be, for example, equal to or higher than 1300° C.

As described, the first embodiment is characterized in that, after the grinding of the back surface 11b of the n⁻-type silicon carbide substrate 11, the p-type impurity is implanted, the p-type impurity is activated by the laser annealing, the back surface barrier metal is thereafter formed, and the sintering is executed. By executing the above, the laser light beam is not reflected by the back surface barrier metal during the laser annealing at step S5 and the focus of the laser light beam may be put on the region having the p-type impurity implanted therein of the n⁻-type silicon carbide substrate 11. For the laser annealing at step S5, for example, a YAG laser (preferably, the second harmonic thereof) may be used. The temperature of only the vicinity of the point at which the p-type impurity is implanted of the n⁻-type silicon carbide substrate 11 may be increased to, for example, about 2000° C.

The laser annealing at step S5 may be executed at a temperature, for example, equal to or higher than about 500° C. and equal to or lower than 2000° C. The pulse width (a half value width) of the laser light beam may be, for example, in a range equal to or larger than about 300 ns and equal to or smaller than about 800 ns. Plural sessions (plural rounds) of laser application may be executed for the laser light beam to be applied plural times at the same point in the n⁻-type silicon carbide substrate 11. The temperature at the point to which the laser light beam is applied of the n⁻-type silicon carbide substrate 11 is increased, for example, up to about 2,000° C. while the element properties are not adversely influenced thereby because the time period for the temperature increase is extremely short.

As depicted in FIG. 1A, hydrogen ion implantation 16 using protons, deutrons, or the like (hereinafter, collectively referred to as "proton implantation 16") is executed from the back surface side 11b of the n⁻-type silicon carbide substrate 11 (step S6). In the proton implantation 16, hydrogen ions are implanted at a position deeper than the p-type collector layer 4 from the back surface 11b of the n⁻-type silicon carbide substrate 11 causing the hydrogen ions to pass through the back surface barrier metal and the p-type collector layer 4 of the back surface 11b of the n⁻-type silicon carbide substrate 11.

At step S8, the hydrogen ions are caused to be locally present at a predetermined depth corresponding to the range 17 of the protons by variously selecting the application energy of the proton implantation 16. The description will be made below taking an example of a case where protons are used as the hydrogen ions to be implanted into the n⁻-type silicon carbide semiconductor substrate 11.

The n⁺-type field stop layer 3 is formed by converting the protons in the n⁻-type silicon carbide substrate 11 into donors by heating the overall n⁻-type silicon carbide substrate 11 using furnace annealing (step S9). The temperature of the furnace annealing is set to be in a range lower than the temperature of the sintering of the back surface barrier metal and may be, for example, equal to or higher than about 500° C. and equal to or lower than about 1500° C. The inventors confirmed that the activation rate of the hydrogen induced donors in the n⁻-type silicon carbide substrate 11 became highest when the temperature of the furnace annealing was equal to or higher than about 900° C. and equal to or lower than about 1300° C. This temperature range is higher than the temperature used when a silicon (Si) substrate is used. More preferably, the temperature of the furnace annealing is equal to or higher than about 1000° C. and equal to or lower than about 1200° C. Further preferably, the temperature of the furnace annealing is equal to or higher than about 1100° C. and equal to or lower than about 1200° C.

The furnace annealing refers to execution of thermal treatment for a semiconductor wafer (the n⁻-type silicon carbide substrate 11) inserted in an isothermal furnace such as, for example, an electric furnace whose temperature is maintained at a constant temperature, and refers to thermal treatment that heats the overall wafer. Preferably, this furnace annealing is executed, when possible, for example, at a temperature equal to or lower than about 1500° C. and for a time period equal to or longer than about one hour and equal to or shorter than about 10 hours. The reason for this is that, when the temperature of the furnace annealing is set to be higher than 1500° C., the hydrogen atoms introduced by the proton implantation 16 are diffused and, in addition, the amount of the crystal defects is insufficient relative to the amount necessary for generating the donors using protons and the donor production rate is reduced. The conversion of the protons into the donors is facilitated by executing the furnace annealing (the proton annealing) at a temperature at least equal to or lower than 1500° C.

With the furnace annealing, the crystal defects (the disorders) remaining in the region through which the protons pass (hereinafter, referred to as "proton passing-through region") 14 are reduced and the n-type disorder reduction region 18 is formed. For example, the furnace annealing reduces the density of each of the types of disorders such as the vacancies, the point defects and the dangling bonds mainly including divacancies, and dislocations, generated in the proton passing-through region 14 during the proton implantation 16. These disorders are the cause of the carrier scattering and therefore cause also degradation of the carrier mobility. The implantation 16 and the passing through of the protons reduce the carrier mobility of the proton passing-through region 14 to a value that is equal to or lower than 10% relative to the carrier mobility in the case of a perfect crystal state (without any cause of the carrier scattering). Reduction of the disorders by executing the furnace annealing may increase the carrier mobility in the proton passing-through region 14 to be equal to or higher than 30% and equal to or lower than 100% of the carrier mobility in the case of the perfect crystal state. The carrier mobility of the n-type disorder reduction region 18 may be equal to or higher than 30% and equal to or lower than 100% of the carrier mobility in the case of the perfect crystal state.

At step S9, the disorders remaining in the proton passing-through region 14 may be reduced after the furnace annealing to further recover the crystallinity of the n⁻-type silicon carbide substrate 11. In this case, after the furnace annealing, the region from the back surface 11b of the n⁻-type silicon carbide substrate 11 to the depth within the range 17 of the protons may be heated by, for example, laser annealing.

As described, at steps S8 and S9, the n⁺-type field stop layer 3 whose doping concentration is higher than that of the n⁻-type silicon carbide substrate 11 is formed at the position deeper than the p-type collector layer 4, from the back surface 11b of the n⁻-type silicon carbide substrate 11. The n⁺-type field stop layer 3 may be formed by executing the proton implantation 16 from the back surface 11b of the n⁻-type silicon carbide substrate 11 and executing the furnace annealing process to convert the protons into the donors causing the crystal defects to properly remain. The portion from the n⁺-type field stop layer 3 of the n⁻-type silicon carbide substrate 11 to the p-type base region 22 is the n⁻-type drift layer 1 through which the main current flows and that maintains the main breakdown voltage.

A metal layer is deposited to fill the contact hole to form an emitter electrode 25 as the front surface electrode (step S10). In this case, the emitter electrode 25 may be a metal layer including aluminum or an aluminum-silicon alloy, and the sintering temperature for the emitter electrode 25 may be, for example, 400° C. to 500° C. A surface protective film not depicted is formed on the front surface 11a of the n⁻-type silicon carbide substrate 11 (step S11).

The metal layer is deposited on the back surface 11b of the n⁻-type silicon carbide substrate 11 using, for example, vacuum sputtering to form the back surface electrode (not depicted) that is electrically connected to the p-type collector layer 4 (step S12). The back surface electrode is formed to contact the back surface barrier metal formed at steps S6 and S7. The back surface electrode may include aluminum or an aluminum-silicon alloy. The back surface barrier metal and the back surface electrode function as a collector electrode. After the back surface electrode is formed at step S12, when necessary, metal annealing (sintering for the back surface electrode) may be executed. Thereafter, the semiconductor wafer is cut into chips (diced) and the SiC-IGBT 100 depicted in FIG. 1 is thereby completed.

As described, the crystal defects generated during the proton implantation 16 are reduced by executing the furnace annealing to convert the protons into the donors. The furnace annealing executed at step S9 is an extremely effective method for producing the donors and recovering the crystallinity of the n⁻-type silicon carbide substrate 11.

As described, according to the first embodiment, after the proton implantation, the hydrogen induced donors may be formed and the n-type field stop layer may be formed by the furnace annealing, and the disorders generated in the proton passing-through region may be reduced. Occurrence of degradation of the electric properties may therefore be stably prevent such as degradation of the carrier mobility, increased loss, increased conduction resistance, increased leak current at each of the disorder generation points. An inexpensive silicon carbide semiconductor device having predetermined electric properties may be provided with an excellent yield. According to the first embodiment, the laser annealing is executed to activate the p-type impurity before the back surface barrier metal is formed and the laser light beam is therefore not reflected by the back surface barrier metal. The laser annealing to activate the p-type impurity may be executed at a predetermined temperature.

Figure 3A:
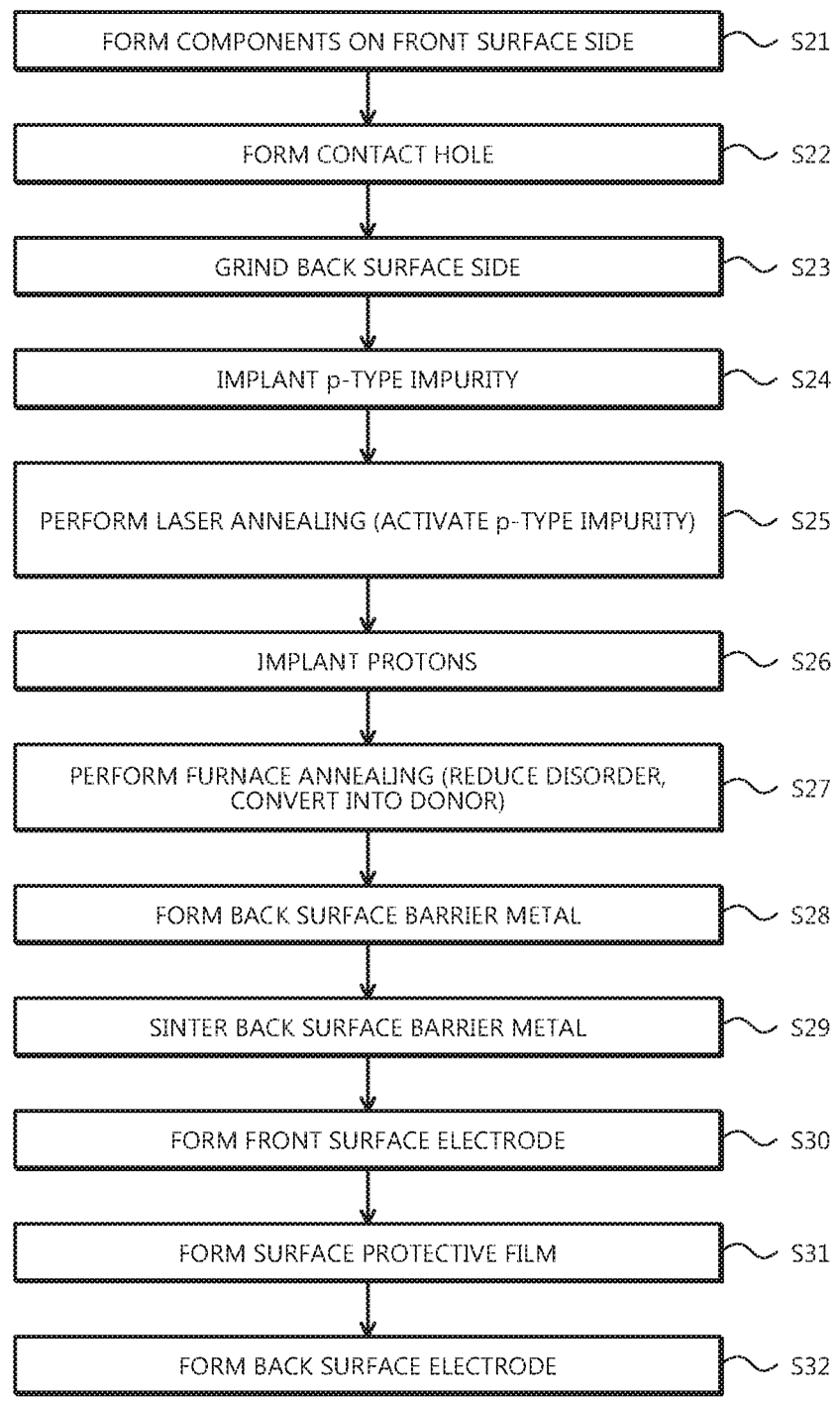
FIG. 3A is a flowchart of an overview of the method of manufacturing a silicon carbide semiconductor device according to a second embodiment.

A method of manufacturing a silicon carbide semiconductor device according to a second embodiment will be described. FIG. 3A is a flowchart of an overview of the method of manufacturing a silicon carbide semiconductor device according to the second embodiment. The method of manufacturing a silicon carbide semiconductor device according to the second embodiment differs from the method of manufacturing a silicon carbide semiconductor device according to the first embodiment in that the pair of the disposition of the back surface barrier metal and the sintering of the back surface barrier metal is replaced with a pair of the proton implantation 16 and the furnace annealing.

For example, similar to the first embodiment, the process steps from the disposition of the components on the front surface side to the laser annealing (steps S21 to S25) are sequentially executed and the process steps of the proton implantation 16, the furnace annealing, the disposition of the back surface barrier metal, and the sintering of the back surface barrier metal (steps S26 to S29) are thereafter sequentially executed. The methods and the conditions for the proton implantation 16, the furnace annealing, the disposition of the back surface barrier metal, and the sintering of the back surface barrier metal are similar to those employed at steps S8, S9, S6, and S7 of the first embodiment (see FIG. 2). In this case, the temperature of the furnace annealing executed at step S27 may be higher than the temperature of the sintering for the back surface barrier metal executed at step S29. For example, when the temperature of the sintering for the back surface barrier metal is equal to or lower than 1100° C., the temperature of the furnace annealing is executed at a temperature equal to or higher than 1100° C. Similar to the first embodiment, thereafter, the process steps including and after the disposition of the front surface electrode (steps S30 to S32) are sequentially executed and the SiC-IGBT 100 depicted in FIG. 1 is thereby completed.

As described, according to the second embodiment, the same effect as that of the first embodiment may be achieved.

A method of manufacturing a silicon carbide semiconductor device according to a third embodiment will be described. FIG. 3B is a flowchart of an overview of the method of manufacturing a silicon carbide semiconductor device according to the third embodiment. The method of manufacturing a silicon carbide semiconductor device according to the third embodiment differs from the method of manufacturing a silicon carbide semiconductor device according to the second embodiment in that the laser annealing is executed after the proton implantation 16 and before the disposition of the back surface barrier metal.

For example, similar to the first embodiment, the process steps from the disposition of the components on the front surface side to the ion implantation of the p-type impurity are sequentially executed (steps S41 to S44). The proton implantation 16 is executed (step S45). The method and the conditions for the proton implantation 16 are same as those employed at step S8 of the first embodiment (see FIG. 2). The implantation of the p-type impurity executed at step S44 and the proton implantation 16 executed at step S45 may be replaced with each other.

The furnace annealing is executed (step S46). The laser annealing is executed (step S47). The methods and the conditions for the furnace annealing and the laser annealing are same as those employed at steps S9 and S5 of the first embodiment (see FIG. 2). In this case, in the furnace annealing executed at step S46, a crystal defect layer 15 (the disorders) generated in the proton passing-through region 14 by the proton implantation 16 is reduced (the n-type disorder reduction region 18 is formed) to recover the crystallinity of the n⁻-type semiconductor substrate 11 and to covert the protons into donors to form the n⁺-type field stop layer 3. This furnace annealing enables, for example, reduction of the disorders and conversion of the protons into the donors in a portion relatively deep from the back surface 11b of the n⁻-type silicon carbide substrate 11.

In the laser annealing executed at step S47, the disorders are further reduced to further recover the crystallinity of the n⁻-type silicon carbide substrate 11, to further facilitate the conversion into the donors, and to activate the p-type impurity. The p-type collector layer 4 is thereby formed. This laser annealing enables, for example, reduction of the disorders and the conversion of the protons into the donors in the portion relatively shallow from the back surface 11b of the n⁻-type silicon carbide substrate 11. The two annealing sessions of the furnace annealing and the laser annealing recover the crystallinity of the n⁻-type silicon carbide substrate 11 to a predetermined state thereof and realize a predetermined doping concentration profile of the n⁺-type field stop layer 3.

The temperatures of the furnace annealing executed at step S46 and the laser annealing executed at step S47 may be higher than the temperature of the sintering for the back surface barrier metal executed at step S49 described later. The furnace annealing executed at step S46 may be omitted to execute only the laser annealing executed at step S47. In this case, the laser annealing executed at step S47 alone recovers the crystallinity of the n⁻-type silicon carbide substrate 11 to a predetermined state thereof, converts the protons into the donors to form the n⁺-type field stop layer 3 having a predetermined doping concentration profile, and activates the p-type impurity to form the p-type collector layer 4.

The disposition of the back surface barrier metal and the sintering of the back surface barrier metal are sequentially executed (steps S48 and S49). The methods and the conditions for the disposition of the back surface barrier metal and the sintering of the back surface barrier metal are same as those employed at steps S6 and S7 of the first embodiment (see FIG. 2). Thereafter, similar to the first embodiment, the process steps including and after the disposition of the front surface electrode (steps S50 to S52) are sequentially executed and the SiC-IGBT 100 depicted in FIG. 1 is thereby completed.

When the laser annealing is executed after the proton implantation 16 as above, not only the hydrogen induced donors are formed (or the activation rate of the hydrogen induced donors is improved) but also the disorders are reduced. Especially, the inventors confirmed that, different from a case where the silicon substrate is used, the hydrogen atoms present at a position deep from the surface for the laser application may also be activated by the laser annealing in the silicon carbide substrate.

The result of verification is depicted in FIG. 1B for the difference between doping concentration profiles 12 and 13 taken in the vicinity of the n⁺-type field stop layer 3 based on the presence or absence of the laser annealing (with the laser annealing, without the laser annealing). According to the method of manufacturing a silicon carbide semiconductor device of the third embodiment, the SiC-IGBT 100 was manufactured whose crystallinity of the n⁻-type silicon carbide substrate 11 was recovered by executing the laser annealing executed after the proton implantation 16 and the furnace annealing (with the laser annealing: hereinafter, referred to as "Example"). The doping concentration profile 12 of Example was the concentration profile acquired after the crystal defects remaining after the furnace annealing were reduced by the laser annealing. As the one to be compared, the doping concentration profile 13 is indicated by a dotted line, of a SiC-IGBT (without the laser annealing: hereinafter, referred to as "Comparative Example") whose crystal defects were caused to remain by not executing the laser annealing after the proton implantation 16 and the furnace annealing.

As depicted in FIG. 1B, in the doping concentration profile 13 of Comparative Example, the crystal defect layer 15 spreads in a region corresponding to the proton passing-through region 14 of the doping concentration profile 12 of Example. In Comparative Example, because the crystal defect layer 15 remained, in the region having the crystal defect layer 15 remaining therein, the electron mobility and the hole mobility were degraded and the n⁻-type silicon carbide substrate 11 acted as a high resistance layer. The leak current increased in the region having the crystal defect layer 15 remaining therein. FIG. 1B depicts the high resistance layer (a layer having higher resistance than that of the initial n⁻-type silicon carbide substrate 11), formed due to the remaining of the crystal defect layer 15, as reduction of the doping concentration. The electron mobility and the hole mobility are handled to be constant, and the increase of the resistance in the n⁻-type silicon carbide substrate 11 is depicted as reduction of the doping concentration. The amount of the dropped doping concentration in FIG. 1B therefore indicates the amount of the crystal defects.

In the doping concentration profile 13 of Comparative Example, the doping concentration of the n⁻-type silicon carbide substrate 11 is reduced immediately before the n⁺-type field stop layer 3 is formed (the proton passing-through region 14). It can therefore be seen that the crystal defect layer 15 was formed in the proton passing-through region 14. Each of the doping concentrations was a value calculated from the value of the specific resistance actually measured using a scanning spreading resistance measurement (SSRM) method, and was a value calculated assuming that the hole mobility and the electron mobility were each constant. When a crystal defect is present, reduction of the doping concentration, and degradation of the electron mobility and the hole mobility occur due to the recoupling while all the reduced amounts of the electron mobility and the hole mobility are depicted to be included in the reduced amount of the doping concentration. The relation between the doping concentration N (/cm³) and the specific resistance R (Ω·cm) is represented by R=1/μ·q·N. "μ" is the mobility (cm²/V·s) and "q" is the charge ($1.6 \times 10^{-19}$ coulomb).

On the other hand, in the present invention, the crystal defect layer 15 present in the proton passing-through region 14 on the back surface side 11b of the n⁻-type silicon carbide substrate 11 is reduced by the laser annealing to recover the crystallinity of the n⁻-type silicon carbide substrate 11. The doping concentration profile 12 of Example therefore has no dropping of the doping concentration in the proton passing-through region 14 generated therein. The electric properties such as the leak current are thereby improved.

Figure 4A:
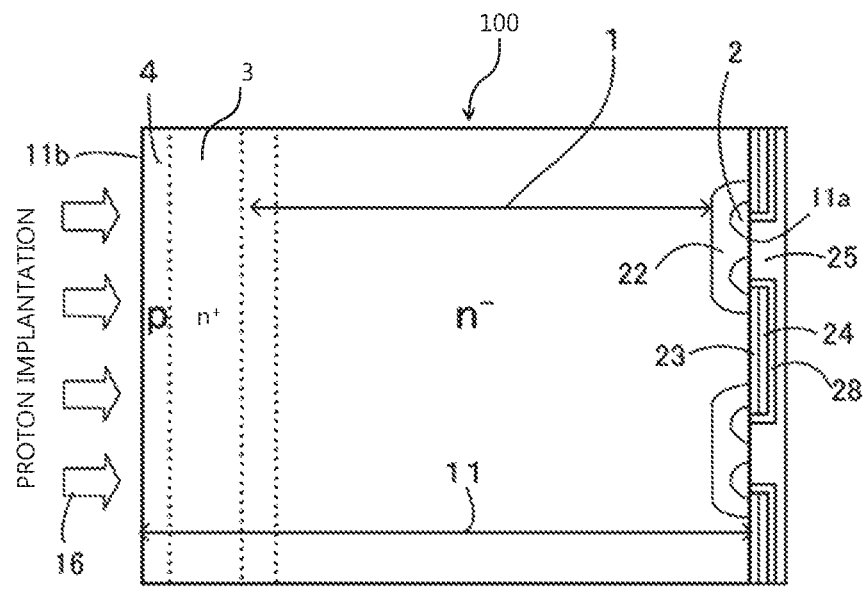
FIGS. 4A and 4B are explanatory diagrams of another example of the silicon carbide semiconductor device according to the third embodiment.
Figure 4B:
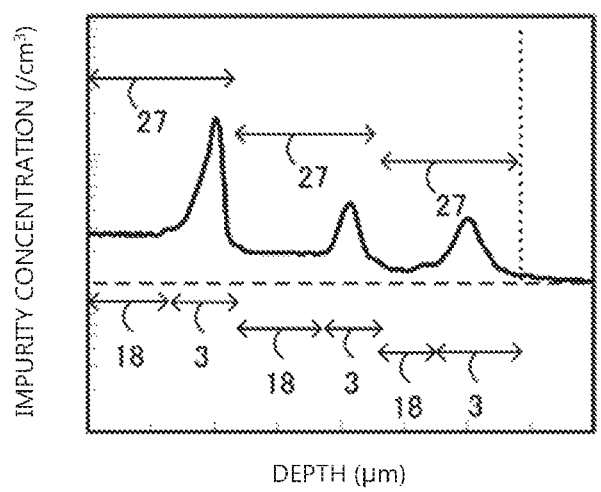
Figure 8A:
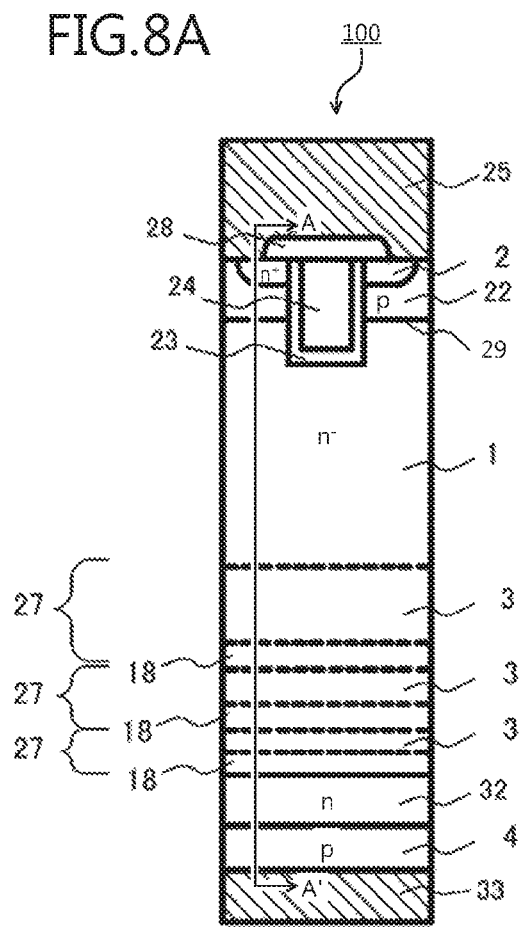
FIGS. 8A and 8B are explanatory diagrams of another example of the silicon carbide semiconductor device according to the third embodiment.
Figure 8B:
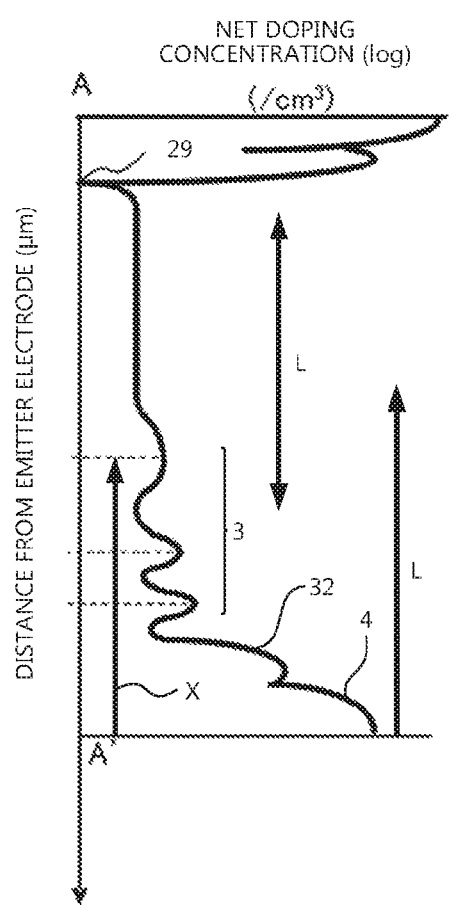

At step S45, plural sessions of the proton implantation 16 may be executed using different values of the acceleration energy to form plural stages of n⁺-type field stop layer 3 at different depths from the back surface of the substrate. FIGS. 4A and 8A each depict a cross-sectional structure of a SiC-IGBT 100 that includes the plural-stage n⁺-type field stop layer 3. A trench gate structure may be applied to the SiC-IGBT 100. FIG. 8A depicts a cross-sectional structure of the SiC-IGBT 100 including an ordinary trench structure. FIGS. 4A, 4B, 8A, and 8B are explanatory diagrams of another example of the silicon carbide semiconductor device according to the third embodiment. FIG. 4A depicts the plural-stage n⁺-type field stop layer 3 in a simplified form and FIG. 4B depicts the doping concentration distribution of the plural-stage n⁺-type field stop layer 3 of FIG. 4A. FIG. 8A depicts the cross-sectional structure of the trench gate SiC-IGBT 100 and FIG. 8B depicts the net doping concentration distribution of a silicon carbide semiconductor unit of FIG. 8A.

The configurations other than the n⁺-type field stop layer 3 of the SiC-IGBT 100 depicted in FIG. 4 are same as those of the SiC-IGBT 100 depicted in FIG. 1A. The configurations other than the n⁺-type field stop layer 3 and the trench structure of the SiC-IGBT 100 depicted in FIG. 8A are same as those of the SiC-IGBT 100 depicted in FIG. 1A. In FIG. 8A, a reference numeral "29" denotes a pn-junction between the p-type base region 22 and the n⁻-type drift layer 1 and a reference numeral "33" denotes a collector electrode. As depicted in FIGS. 4A and 8A, when the plural-stage n⁺-type field stop layer 3 is formed, the plural n-type intermediate layers 27 are formed each including one n⁺-type field stop layer 3 and one n-type disorder reduction region 18 adjacent to the side of the face for the proton implantation of the n⁺-type field stop layer 3 as a pair.

In FIG. 8A, a reference numeral "32" denotes a leak stop layer whose doping concentration is higher than that of the n⁺-type field stop layer 3 and whose doping concentration is lower than that of the p-type collector layer 4. The leak stop layer 32 is formed between the p-type collector layer 4 and the n⁺-type field stop layer 3. The leak stop layer 32 only has to be formed by, for example, executing ion implantation of an n-type impurity such as phosphorus (P) following the implantation of the p-type impurity to form the p-collector layer 4. The implantation of the n-type impurity to form the leak stop layer 32 is executed before the furnace annealing executed at step S46, and the n-type impurity only has to be activated by the furnace annealing and the laser annealing (step S47) executed thereafter. The order of each of the implantation of the n-type impurity to form the leak stop layer 32, the implantation of the p-type impurity to form the p-type collector layer 4, and the proton implantation 16 may be exchanged with each other. In the SiC-IGBT 100 depicted in FIG. 1A and an SiC-IGBT 100 depicted in FIG. 9A described later, the leak stop layer 32 may also be formed between p-type collector layer 4 and the n⁺-type field stop layer 3.

The SiC-IGBTs 100 depicted in FIGS. 4A and 8A may be manufactured being applied with the method of manufacturing a semiconductor device according to each of the first and the second embodiments. The plural sessions of the proton implantation 16 using different values of acceleration energy may be executed at step S8 of the first embodiment (see FIG. 2) or at step S26 of the first embodiment (see FIG. 3A).

As described, according to the third embodiment, the same effect as that of each of the first and the second embodiments may be achieved. According to the third embodiment, occurrence of degradation of the electric properties can more stably be prevented because the disorders in the proton passing-through region may be reduced by the laser annealing executed after the proton implantation. According to the third embodiment, the laser annealing can reduce the disorders and can form the n-type field stop layer and the p-type collector layer.

Figure 5:
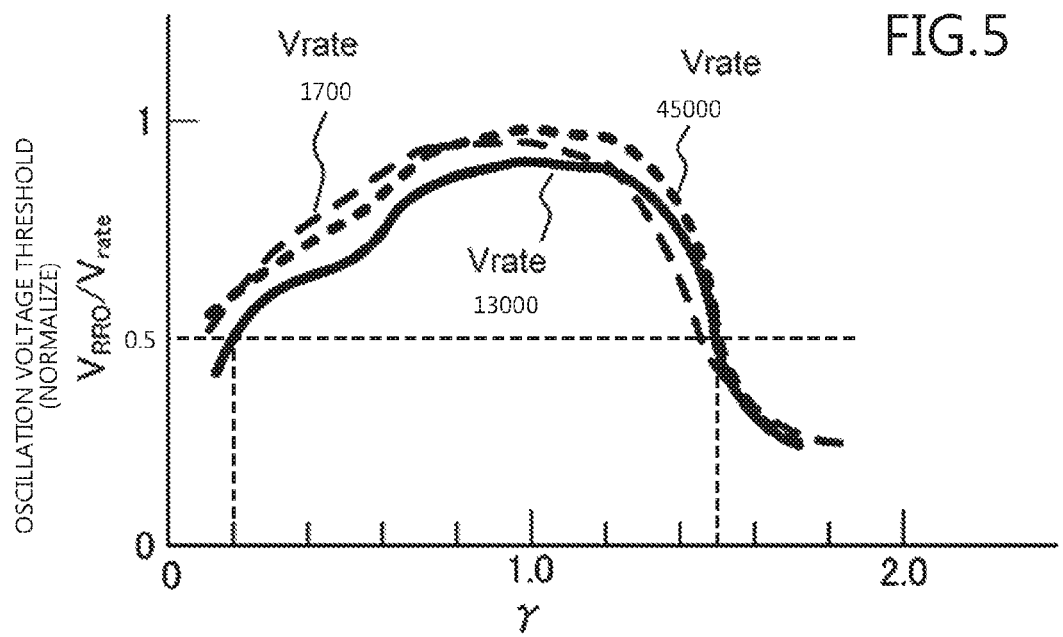
FIG. 5 is a property chart of a threshold voltage at which a voltage waveform of an ordinary IGBT starts to oscillate.
Figure 6:
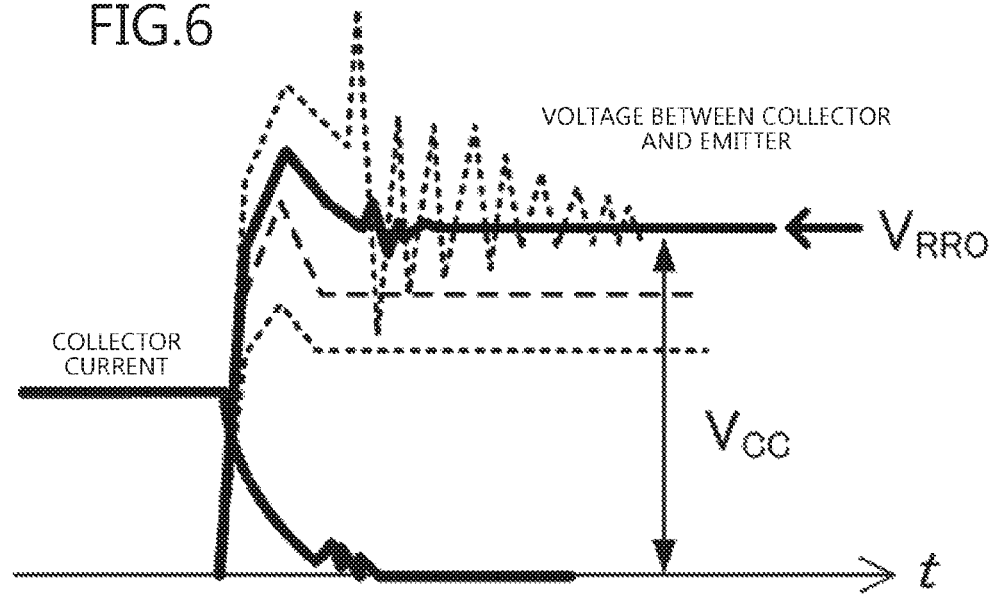
FIG. 6 is a property chart of a turn-off oscillation waveform of the ordinary IGBT.

An advantageous position of a peak of the doping concentration (hereinafter, referred to as "proton peak") of a first-stage n⁺-type field stop layer of the plural-stage n⁺-type field stop layer 3 formed by the plural-stage proton implantation will be described as a fourth embodiment taking an example of the ordinary IGBT. FIG. 5 is a property chart of a threshold voltage at which the voltage waveform of the ordinary IGBT starts to oscillate. FIG. 6 is a property chart of a turn-off oscillation waveform of the ordinary IGBT.

FIG. 7 is a table of the positional conditions of the field stop (FS) layer first reached by a depletion layer in the semiconductor device according to the present invention. The first-stage n$^+$-type field stop layer refers to the n$^+$-type field stop layer formed at the deepest position from the back surface of the n$^-$-type silicon carbide semiconductor substrate (closest to the side of the p-type base region). Other n$^+$-type field stop layers are formed to be a second-stage, a third stage, . . . , an n-th stage n$^+$-type field stop layer in the direction from the first-stage n$^+$-type field stop layer toward the back surface side of the n$^-$-type silicon carbide substrate. The position of the proton peak refers to the depth of the peak of the doping concentration (the proton peak) of the n$^+$-type field stop layer from the back surface of the n$^-$-type silicon carbide semiconductor substrate.

As depicted in FIG. 6, when the collector current is equal to or less than $\frac{1}{10}$ of the rated current, the turn-off waveform may oscillate immediately before turn off ends because there are few accumulated carriers. For example, the collector current is fixed at a value and the IGBT is turned off with different power source voltages $V_{cc}$. In this case, when the power source voltage $V_{cc}$ exceeds a predetermined value, the peak value of the ordinary overshoot voltage is exceeded and an additional overshoot thereafter occurs in the collector-emitter voltage waveform. This additional overshoot (a voltage) acts as a trigger and the voltage waveform thereafter oscillates. When the power source voltage $V_{cc}$ further exceeds this predetermined value, the additional overshoot voltage is further increased and the amplitude of the oscillation of the voltage waveform thereafter is also increased. The threshold voltage at which the voltage waveform starts to oscillate as above is called "oscillation starting threshold value $V_{RRO}$". When the IGBT is turned off, the turn-off waveform does not oscillate the higher oscillation starting threshold value $V_{RRO}$ is, which is therefore advantageous.

The oscillation starting threshold value $V_{RRO}$ depends on the position of the proton peak of the first-stage n$^+$-type field stop layer (closest to the side of the p-type base region) first reached by the depletion layer (strictly, a space-charge region because holes are present therein) spreading from the pn-junction between the p-type base region and the n$^-$-type drift layer to the n$^-$-type drift layer, of the plural-stage n$^+$-type field stop layer. The reason for this is as follows. When the depletion layer spreads from the pn-junction between the p-type base region and the n$^-$-type drift layer to the n$^-$-type drift layer during turn off, an end of the depletion layer reaches the first-stage n$^+$-type field stop layer (closest to the p-type base region side) and the spreading of the depletion layer is thereby suppressed to weaken the flushing of the accumulated carriers. As a result, exhaustion of the carriers is suppressed and oscillation of the turn-off waveform is suppressed.

The depletion layer during turn off spreads from the pn-junction between the p-type base region and the n$^-$-type drift layer toward the collector electrode along the depth direction. The n$^+$-type field stop layer first reached by the depletion layer is the n$^+$-type field stop layer that is closest to the pn-junction between the p-type base region and the n$^-$-type drift layer. The thickness of the n$^-$-type silicon carbide substrate (the thickness of the semiconductor portion sandwiched by the emitter electrode and the collector electrode) is denoted by "W0" and the depth from the interface between the collector electrode and the n$^-$-type silicon carbide substrate (hereinafter, referred to as "distance from the back surface of the n$^-$-type silicon carbide substrate") of the position of the proton peak of the n$^+$-type field stop layer first reached by the depletion layer is denoted by "X". A distance index L is introduced. The distance index L is represented by equation (1) below.

$$L = \sqrt{\frac{\varepsilon_S V_{rate}}{\left(\frac{J_F}{qv_{sat}} + N_d\right)2q}} \quad (1)$$

Figure 9A:
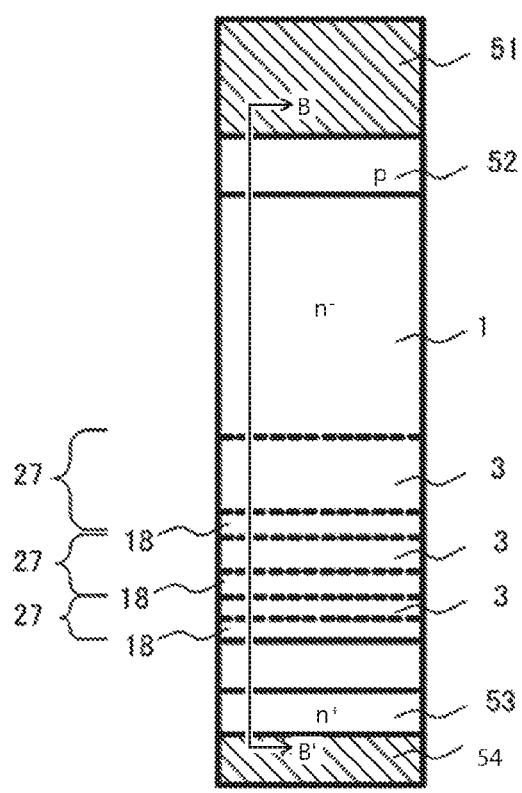
FIG. 9A is a cross-sectional diagram of the structure of the silicon carbide semiconductor device according to a fifth embodiment.
Figure 9B:
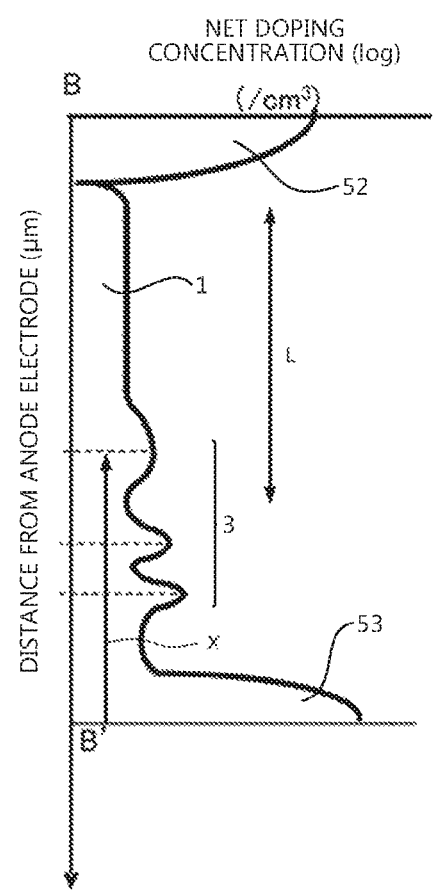
FIG. 9B depicts a net doping concentration distribution of the silicon carbide semiconductor portion of FIG. 9A.

The distance index L represented by equation (1) is an index that indicates the distance from the pn-junction, of the end of the depletion layer (correctly, the space-charge region) (the depletion layer end) spreading from the pn-junction between the p-type base region and the n$^-$-type drift layer to the n$^-$-type drift layer when the increasing collector-emitter voltage $V_{CE}$ matches the power source voltage $V_{CC}$ during turn off. Of the fraction inside the square root, the denominator represents the space-charge density of the space-charge region (the depletion layer) during the turning off. The known Poisson's equation is represented by div $E = \rho/\varepsilon$. "E" is the electric field intensity and "$\rho$" is the space-charge density. The space-charge density $\rho$ is represented by $\rho = q(p - n + N_d - N_a)$. "q" is the elementary charge. "p" is the hole density. "n" is the electron density. "$N_d$" is the donor density. "$N_a$" is the acceptor density. "$\varepsilon_S$" is the dielectric constant of the semiconductor. Especially, the donor density $N_d$ is the average density acquired by integrating the n$^-$-type drift layer in the depth direction and dividing the result of the integration by the distance of the section of the integration. For example, for the SiC-IGBT 100 depicted in FIG. 8B and the SiC-diode depicted in FIG. 9B described later, the net doping concentration refers to the net doping concentration of $N_d - N_a$ and the axis of abscissa of FIG. 9B represents the absolute value of $N_d - N_a$.

The space-charge density $\rho$ is described using the density p of the holes that quickly pass through the space-charge region (the depletion layer) during turn off, and the average donor density $N_d$ of the n$^-$-type drift layer. The electron density is negligible compared to the hole density p and the donor density $N_d$, and no acceptor is present. Therefore, the space-charge density $\rho$ may be represented by $\rho \approx q(p + N_d)$. The hole density $\rho$ in this case is determined based on the breaker current of the IGBT and is represented by $p = J_r/(qv_{sat})$ because the state where current having the rated current density of the element flows is especially assumed. "Jr" is the rated current density of the element. "$v_{sat}$" is the saturated velocity acquired when the velocity of the carriers saturates at a predetermined electric field intensity.

Poisson's equation is integrated twice for the distance X and the voltage V is $E = -\text{grad}V$ (the known relation between the electric field E and the voltage V). The voltage V is therefore $V = (\frac{1}{2})(\rho/\varepsilon)x^2$ when the boundary condition is properly taken. The length x of the space-charge region acquired when the voltage V is set to be, for example, $\frac{1}{4}$ to $\frac{1}{2}$ of the rated voltage $V_{rate}$ is determined as the distance index L. The reason for this is that the operation voltage (the power source voltage) to be the voltage V is set to be about $\frac{1}{4}$ to about $\frac{1}{2}$ the value of the rated voltage (for example, $\frac{1}{4}$) for an actual device such as an inverter. The N$^+$-type field stop layer has a function of suppressing in the N$^+$-type field stop layer, the spreading of the expansion of the space-charge region spreading during turn off, by setting the doping concentration to be a higher concentration than that of the N$^-$-type drift layer. In a case where the collector current of the IGBT starts to decrease from the breaker current due to turning off of the MOS gate, when the position of the proton peak of the N$^+$-type field stop layer first reached by the depletion layer just matches the length of the space-charge region, the expansion of the space-charge region may be suppressed with the accumulated carriers remaining in the N⁻-type drift layer, and the flushing of the remaining carriers is therefore suppressed.

In the actual turn-off operation, for example, when the IGBT module drives a motor using a known PWM inverter, the power source voltage and the breaker current are not fixed and are often variable. A degree of range is therefore necessary for the advantageous position of the proton peak of the N⁺-type field stop layer first reached by the depletion layer when the power source voltage and the breaker current are variable. As a result of the active research by the inventors, the distance X that is from the back surface of the substrate, of the proton peak of the N⁺-type field stop layer first reached by the depletion layer is as shown in the table depicted in FIG. 7. FIG. 7 depicts the distance X of the proton peak of the N⁺-type field stop layer first reached by the depletion layer from the back surface of the substrate, with each of the rated voltages of 1,200 V to 45,000 V. In this case, X is represented as X=W0−γL and "γ" is a coefficient. FIG. 7 depicts this X obtained when this γ is varied from 0.3 to 1.5.

As depicted in FIG. 7, elements (the IGBTs) having different rated voltages are each designed to secure a breakdown voltage that is higher than the rated voltage by about 10% for safety. The elements have a total thickness of the n⁻-type silicon carbide substrate (the thickness of the product at the time of completion after reducing the thickness by grinding or the like) that is set such that the on-voltage and the turn-off loss become sufficiently low, and the n⁻-type drift layer is set to have the average specific resistance. The "average" means the average doping concentration and the average specific resistance of the overall n⁻-type drift layer including the n⁺-type field stop layer. The rated current density also becomes the typical value depicted in FIG. 7 due to the rated voltage. The rated current density is set such that the energy density determined by the product of the rated voltage and the rated current density is a substantially constant value, and substantially becomes the values depicted in FIG. 7. Calculation of the distance index L using these values and according to equation (1) gives the values depicted in FIG. 7. The distance X from the back surface of the substrate, of the proton peak of the N⁺-type field stop layer first reached by the depletion layer is the value obtained by subtracting the value obtained by setting the coefficient γ to be 0.3 to 1.5 for the distance index L from the thickness W0 of the n⁻-type silicon carbide substrate.

The coefficient γ that determines the distance X from the back surface of the substrate, of the proton peak of the N⁺-type field stop layer first reached by the depletion layer end, is as follows to sufficiently suppress the oscillation of the turn-off waveform with the values of the distance index L and the thickness W0 of the n⁻-type silicon carbide substrate. For example, FIG. 5 depicts a graph of the dependency of the oscillation starting threshold value $V_{RRO}$ on the coefficient γ for some typical rated voltages $V_{rate}$ (1700 V, 13,000 V, and 45,000 V). The axis of ordinate of FIG. 5 normalizes the oscillation starting threshold value $V_{RRO}$ using the rated voltage $V_{rate}$ (=$V_{RRO}/V_{rate}$). It may be seen that the coefficient γ may rapidly increase the oscillation starting threshold value $V_{RRO}$ with the coefficient γ that is equal to or smaller than 1.6 for all three examples of rated voltages.

As described, in an actual device such as an inverter, because the operation voltage to be the voltage V (the power source voltage $V_{cc}$) is set to be about half the value of the rated voltage $V_{rate}$, at least oscillation of the turn-off waveform of the IGBT has to be prevented when the power source voltage $V_{cc}$ is set to be half the value of the rated voltage $V_{rate}$. The value obtained by normalizing the oscillation starting threshold value $V_{RRO}$ by the rated voltage $V_{rate}$ has to be equal to or greater than 0.5 ($V_{RRO}/V_{rate} \geq 0.5$). From the result depicted in FIG. 5, the value obtained by normalizing the oscillation starting threshold value $V_{RRO}$ by the rated voltage $V_{rate}$ ($V_{RRO}/V_{rate}$) is equal to or greater than 0.5 when the coefficient γ is equal to or greater than 0.2 and equal to or smaller than 1.5 and, therefore, at least the coefficient γ may be set to be 0.2 to 1.5.

Any one of the rated voltages $V_{rate}$ not depicted such as those between 1700 V and 13,000 V (such as 3300 V and 6500 V), those between 13,000 V and 45,000 V (such as 26,000 V and 33,000 V), and those equal to or higher than 45,000 V does not significantly depart from the three rated voltages $V_{rate}$ exemplified in FIG. 5, and substantially the same property curves are obtained therewith. The rated voltages $V_{rate}$ not depicted each also present the same dependency (the value of the oscillation starting threshold value $V_{RRO}$ for the coefficient γ) as those of the three rated voltages $V_{rate}$ exemplified in FIG. 5. It may be seen from the property curves depicted in FIG. 5 that the oscillation starting threshold value $V_{RRO}$ may be increased sufficiently even with any of the rated voltages $V_{rate}$ when the coefficient γ is 0.7 to 1.4 ($0.7 \leq \gamma \leq 1.4$).

For example, when the coefficient γ is set to be smaller than 0.7 (γ<0.7), the oscillation starting threshold value $V_{RRO}$ is equal to or higher than about 80% of the rated voltage $V_{rate}$ while the n⁺-type field stop layer becomes close to the p-type base region and the avalanche breakdown voltage of the element may therefore become lower than the rated voltage $V_{rate}$. Therefore, the coefficient γ may be equal to or greater than 0.7 (γ≥0.7). When the coefficient γ is set to be greater than 1.4 (γ>1.4), the oscillation starting threshold value $V_{RRO}$ rapidly decreases from about 70% and oscillation of the turn-off waveform tends to be generated. Preferably, the coefficient γ may be equal to or smaller than 1.4 (γ≤1.4). More preferably, the coefficient γ may be set to be 0.8 to 1.3 ($0.8 \leq \gamma \leq 1.3$). Further preferably, the coefficient γ may be set to be 0.9 to 1.2 ($0.9 \leq \gamma \leq 1.2$). Thereby, the oscillation starting threshold value $V_{RRO}$ may be increased to be maximal setting the avalanche breakdown voltage of the element to sufficiently be higher than the rated voltage $V_{rate}$.

An important point of the property curves of the present invention depicted in FIG. 5 is that the range of the coefficient γ capable of sufficiently increasing the oscillation starting threshold value $V_{RRO}$ is substantially same for any rated voltage $V_{rate}$ (for example, $0.7 \leq \gamma \leq 1.4$). The reason why the advantageous range of the coefficient γ is substantially same for any rated voltage $V_{rate}$ is as follows. It is most effective to set the range of the distance X from the back surface of the substrate, of the proton peak of the N⁺-type field stop layer first reached by the depletion layer, to include the W0−L (that is, γ=1.0) at substantially the center. Inclusion of γ=1.0 as above being most effective originates from the power density (the product of the rated voltage $V_{rate}$ and the rated current density) being substantially constant (for example, $0.8 \times 10^6$ VA/cm² to $3.0 \times 10^6$ VA/cm²). During switching such as turn off, when the voltage of the element becomes a voltage corresponding to the rated voltage $V_{rate}$, the distance (the depth) from the back surface of the substrate to a space layer is substantially the distance index L represented by equation (1). The oscillation of the turn-off waveform may be suppressed during the switching when the proton peak of the first-stage n$^+$-type field stop layer deepest from the back surface of the substrate is present at the position of the distance index L (that is, the coefficient γ is about 1.0). Because the power density is substantially constant, the distance index L is therefore proportional to the rated voltage V$_{rate}$. With any rated voltage V$_{rate}$, thereby, when the range of the distance X from the back surface of the substrate, of the proton peak of the n$^+$-type field stop layer first reached by the depletion layer is set to be a range that includes γ=1.0 at substantially the center thereof, the oscillation starting threshold value V$_{RRO}$ may be set to be sufficiently high and the oscillation suppression effect on the turn-off waveform during the switching may be achieved most strongly.

Based on the above, the accumulated carriers may be caused to sufficiently remain during turn off and the phenomenon of the oscillation of the turn-off waveform may be suppressed during turn off by setting the distance X from the back surface of the substrate, of the proton peak of the n$^+$-type field stop layer first reached by the depletion layer to be in the above range. With any rated voltage V$_{rate}$, therefore, preferably, the distance X from the back surface of the substrate, of the proton peak of the n$^+$-type field stop layer first reached by the depletion layer may be set to be in the above range. The phenomenon of the oscillation of the turn-off waveform during the turning off may be suppressed effectively.

It may be seen from FIG. 7 that, in a case where the rated voltage V$_{rate}$ is equal to or higher than 1,700 V, when the distance X from the back surface of the substrate, of the proton peak of the first-stage n$^+$-type field stop layer deepest from the back surface of the substrate is set to be γ=about 1, the distance index L is deeper than 20 μm for any rated voltage. The reason why the range Rp of the protons to form the first-stage n$^+$-type field stop layer is set to be deeper than 15 μm from the back surface of the substrate and, preferably, to be equal to or larger than 20 μm is exactly that the effect of suppressing the oscillation of the turn-off waveform is most strongly achieved.

As described, according to the fourth embodiment, the same effects as those of each of the first to the third embodiments may be achieved.

The structure of a silicon carbide semiconductor device according to a fifth embodiment will be described. FIG. 9A is a cross-sectional diagram of the structure of the silicon carbide semiconductor device according to the fifth embodiment. FIG. 9A depicts a cross-sectional structure of a diode (hereinafter, referred to as "SiC-diode") and FIG. 9B depicts a net doping concentration distribution of the silicon carbide semiconductor portion of FIG. 9A. The silicon carbide semiconductor device according to the fifth embodiment is an example where the first embodiment is applied to the SiC-diode. In this case, as the method of manufacturing a silicon carbide semiconductor device according to the fourth embodiment, the following processes are executed at steps S1, S4, S5, S10, and S12 of the process flow (FIG. 2) of the method of manufacturing a silicon carbide semiconductor device according to the first embodiment. A p-type anode layer 52 is formed with the formation of the components on the front surface side (step S1). An n$^+$-type cathode layer (a diffusion layer) 53 is formed using ion implantation of, for example, phosphorus, nitrogen (N), or arsenic (As) instead of the ion implantation of the p-type impurity (step S4).

The n-type impurity introduced at step S4 is activated by laser annealing (step S5). An anode electrode 51 is formed with the formation of the front surface electrode (step S10). The back surface electrode to be a cathode electrode 54 is formed with the formation of the back surface electrode (step S12). The process steps of steps S2, S3, S6 to S9, and S11 of the method of manufacturing a silicon carbide semiconductor device according to the fifth embodiment are same as those of the first embodiment. The position from the back surface of the substrate, the doping concentration, and the like of the n$^+$-type field stop layer 3 are properly adjusted similar to those of the first embodiment. The n-type intermediate layer 27 including the pair of the n$^+$-type field stop layer 3 and the n-type disorder reduction region 18 may be formed alone or the plural n-type intermediate layers 27 may be formed. FIG. 9A depicts a case where the plural n-type intermediate layers 27 are formed. When the plural n-type intermediate layers 27 are formed, the advantageous position of the proton peak of the first-stage n$^+$-type field stop layer 3 is same as that of the third embodiment. The second or the third embodiment may be applied to the fifth embodiment.

As described, according to the fifth embodiment, the same effect as that of each of the first to the fourth embodiments may be achieved.

In the description above, the present invention is not limited to the embodiments and may be variously changed within a scope not departing from the gist of the present invention. For example, the hydrogen ions implanted into the n$^-$-type silicon carbide substrate are protons in the embodiments while the hydrogen ions are not limited to protons and may be deuterium ions or tritium ions. Deuterium ($^2$H) ions and tritium ($^3$H) ions each have a shorter range than that of a proton because of the increased mass thereof due to neutron(s). Preferably, protons are therefore used as the hydrogen ions to be implanted into the n$^-$-type silicon carbide substrate to form the n-type intermediate layer at a position deep from the back surface of the n$^-$-type silicon carbide substrate.

However, with the techniques described in US Patent Application 2005/0116249 to US Patent Application No. 2014/0151858, the following problems arise. US Patent Application 2005/0116249 describes remaining of defects introduced by the proton implantation into the semiconductor substrate (degradation of the carrier (the electrons and holes) mobility) while a problem arises that degradation of properties occurs such as increased leak current because a crystal defect layer is present in the vicinity of the back surface of the substrate. Under the conditions for the thermal treatment described in US Patent Application 2006/0286753, the crystal defects cannot be recovered sufficiently when many crystal defects are generated during the proton implantation, and the defects remain. With US Patent Application 2006/0286753, a problem also arises that degradation of the properties occurs such as an increase of leak current due to the crystal defect layer present in the vicinity of the back surface.

Japanese Laid-Open Patent Publication No. 2001-160559 does not describe the defects introduced by the proton implantation. With Japanese Laid-Open Patent Publication No. 2001-160559, a problem also arises that degradation of the properties occurs such as increased leak current due to the crystal defect layer. In Japanese Laid-Open Patent Publication No. 2009-99705, restrictions are imposed such as the temperature of the thermal treatment to recover the defects needs to be lower than the outward diffusion temperature of the protons because the defects are recovered before the proton annealing, and the crystal defect layer may remain. A problem therefore arises that degradation such as increased leak current occurs. In Re-Publication of PCT International Publication No. 2007-55352, the face for the proton implantation (the front surface) and the face for the laser application (the back surface) of the semiconductor substrate are different from each other, and the defects generated spanning from the face for the proton implantation to the region through which the protons pass may be unable to effectively be recovered by the laser annealing.

In Japanese Laid-Open Patent Publication No. 2009-176892, the defects each present at a depth up to 30 μm from the back surface of the substrate are recovered while a problem arises that the defects remain in the vicinity of the surface for the laser application when the defects each present at a depth exceeding 30 μm from the back surface of the substrate are recovered. Even when lasers having wave lengths different from each other are combined with each other, it is difficult to concurrently achieve both stable formation of the donors at a predetermined depth and recovery of the defects in the vicinity of the face for the laser application because temperature distribution occurs in the depth direction from the surface for the laser application. To apply laser light beams having two different wavelengths, a laser light source and application equipment are necessary for each of the laser light beams and increased cost is inevitable. PCT Publication WO 2013/108911 and US Patent Application No. 2014/0151858 do not describe how the hydrogen induced donors are formed when the protons are implanted into the silicon carbide substrate.

According to the present invention, the hydrogen induced donors may be formed and the n-type field stop layer may thereby be formed at the one same heating step, and the crystal defects generated in the proton passing-through region may be reduced.

According to the method of manufacturing a silicon carbide semiconductor device of the present invention, occurrence of degradation of the electric properties may stably be avoided such as degradation of the carrier mobility, increased loss, increased conduction resistance, and increased leak current. An effect is therefore achieved in that an inexpensive silicon carbide semiconductor device having predetermined electric properties may be provided with an excellent yield.

As described, the method of manufacturing a silicon carbide semiconductor device according to the present invention is useful for, for example, semiconductor devices used in power converting equipment such as converters and inverters, and is especially suitable for a silicon carbide semiconductor device such as a diode or an IGBT including a field stop layer.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A method of manufacturing a silicon carbide semiconductor device, the method comprising:
   providing an n-type semiconductor substrate including silicon carbide, the semiconductor substrate having first and second principle surfaces;
   introducing an impurity of a p-type or an n-type from the first principal surface of the n-type semiconductor substrate at a first position;
   activating the impurity to form a diffusion layer of the p-type or the n-type in the n-type semiconductor substrate at a second position;
   implanting protons at a third position that is deeper from the first principal surface of the n-type semiconductor substrate than the first position, the protons generating crystal defects in a region through which the protons pass;
   converting the protons into hydrogen induced donors to form an n-type field stop layer at a fourth position that is deeper from the first principal surface of the n-type semiconductor substrate than the second position;
   reducing the crystal defects generated in the proton passing-through region to form an n-type crystal defect reduction region; and
   forming an electrode on the second principal surface of the n-type semiconductor substrate, wherein
   the protons are implanted before the electrode is formed, and
   the converting the protons and the reducing the crystal defects are executed by same thermal treating at a temperature of a range from 900° C. to 1300° C.

2. The method of manufacturing a silicon carbide semiconductor device according to claim 1, wherein
   the thermal treating heats the entire n-type semiconductor substrate.

3. The method of manufacturing a silicon carbide semiconductor device according to claim 2, wherein
   the thermal treating is performed by furnace annealing.

4. The method of manufacturing a silicon carbide semiconductor device according to claim 1, wherein
   the activating the impurity, the converting the protons into the hydrogen induced donors, and the reducing crystal defects are executed by the same thermal treating.

5. The method of manufacturing a silicon carbide semiconductor device according to claim 4, wherein
   the silicon carbide semiconductor device is manufactured by sequentially performing the steps of introducing the impurity, implanting the protons, and performing the thermal treating.

6. The method of manufacturing a silicon carbide semiconductor device according to claim 4, wherein
   the thermal treating heats the proton passing-through region by laser annealing, which is executed by applying a laser light beam from the first principal surface of the n-type semiconductor substrate.

7. The method of manufacturing a silicon carbide semiconductor device according to claim 1, further comprising
   forming, before introducing the impurity, a front surface element structure of an insulated gate bipolar transistor on the second principal surface side of the n-type semiconductor substrate, wherein
   the introduced impurity is of the p-type, and
   the formed diffusion layer is of the p-type, to thereby form a p-type collector layer.

8. The method of manufacturing a silicon carbide semiconductor device according to claim 1, further comprising
   forming, before introducing the impurity, a front surface element structure of a diode on the second principal surface side of the n-type semiconductor substrate, wherein
   the introduced impurity is of the n-type, and
   the formed diffusion layer is of the n-type, to thereby form an n-type cathode layer.

9. A method of manufacturing a silicon carbide semiconductor device the method comprising:
   providing an n-type semiconductor substrate including silicon carbide, the semiconductor substrate having first and second principle surfaces;
   introducing an impurity of a p-type or an n-type from the first principal surface of the n-type semiconductor substrate at a first position;

activating the impurity to form a diffusion layer of the p-type or the n-type in the n-type semiconductor substrate at a second position;

implanting protons at a third position that is deeper from the first principal surface of the n-type semiconductor substrate than the first position, the protons generating crystal defects in a region through which the protons pass;

converting the protons into hydrogen induced donors to form an n-type field stop layer at a fourth position that is deeper from the first principal surface of the n-type semiconductor substrate than the second position;

reducing the crystal defects generated in the proton passing-through region to form an n-type crystal defect reduction region; and forming an electrode on the second principal surface of the n-type semiconductor substrate, wherein the protons are implanted before the electrode is formed, the converting the protons and the reducing the crystal defects are executed by same thermal treating, and the silicon carbide semiconductor device is manufactured by sequentially performing the steps of introducing the impurity, activating the impurity, implanting the protons, and performing the thermal treating.

10. The method of manufacturing a silicon carbide semiconductor device according to claim 9, wherein the activating the impurity includes applying a laser light beam from the first principal surface of the n-type semiconductor substrate, and the method further includes, after the activating of the impurity, disposing a metal film on the first principal surface of the n-type semiconductor substrate, and forming an ohmic contact with the n-type semiconductor substrate.

11. The method of manufacturing a silicon carbide semiconductor device according to claim 10, wherein the disposing the metal film is executed after the thermal treating.

12. The method of manufacturing a silicon carbide semiconductor device according to claim 10, wherein the forming the ohmic contact includes performing another thermal treating, which is at a temperature lower than that of the thermal treating.

13. A silicon carbide semiconductor device, comprising:

an n-type semiconductor substrate including silicon carbide, the semiconductor substrate having first and second principle surfaces;

a diffusion layer of a p-type or an n-type formed in the n-type semiconductor substrate at the first principal surface thereof;

an n-type field stop layer formed in the n-type semiconductor substrate, at a position deeper from the first principal surface of the n-type semiconductor substrate than a position of the diffusion layer, the n-type field stop layer having a mountain-shaped impurity concentration distribution, a peak thereof being higher than an impurity concentration of the n-type semiconductor substrate, and being higher than a magnitude difference of the impurity concentration of the n-type semiconductor substrate along a depth direction thereof;

an n-type crystal defect region formed in the n-type semiconductor substrate, at a position shallower from the first principal surface of the n-type semiconductor substrate than the position of the n-type field stop layer, an impurity concentration in the n-type crystal defect region being substantially uniform and being lower than that of the n-type field stop layer, and having more crystal defects than the n-type semiconductor substrate;

an element structure formed on the second principal surface of the n-type semiconductor substrate;

a first electrode contacting the diffusion layer; and a second electrode formed on the second principal surface of the n-type semiconductor substrate, wherein the n-type field stop layer includes an n-type semiconductor that has, as donors, the crystal defects including hydrogen atoms, and carrier mobility of the n-type crystal defect region is equal to or higher than 30%, and equal to or lower than 100%, of carrier mobility of the n-type semiconductor substrate.

14. The silicon carbide semiconductor device according to claim 13, wherein the crystal defects in the n-type field stop layer further include vacancies and oxygen atoms.

15. The silicon carbide semiconductor device according to claim 13, wherein the n-type field stop layer includes more hydrogen atoms than the n-type crystal defect region does.

* * * * *